(12) United States Patent
Li et al.

(10) Patent No.: US 11,900,853 B2
(45) Date of Patent: *Feb. 13, 2024

(54) DISPLAY SUBSTRATE AND DISPLAY DEVICE

(71) Applicant: BOE Technology Group Co., Ltd., Beijing (CN)

(72) Inventors: Zhenzhen Li, Beijing (CN); Lujiang Huangfu, Beijing (CN); Shanshan Bai, Beijing (CN); Kuo Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/126,066

(22) Filed: Mar. 24, 2023

(65) Prior Publication Data

US 2023/0237951 A1 Jul. 27, 2023

Related U.S. Application Data

(63) Continuation of application No. 17/992,458, filed on Nov. 22, 2022, now Pat. No. 11,776,452, which is a (Continued)

(30) Foreign Application Priority Data

Jun. 20, 2018 (CN) .......................... 201810638716.2

(51) Int. Cl.
*G09G 3/20* (2006.01)
(52) U.S. Cl.
CPC ... *G09G 3/2074* (2013.01); *G09G 2320/0673* (2013.01); *G09G 2320/0686* (2013.01); *G09G 2340/0407* (2013.01)

(58) Field of Classification Search
CPC ... G09G 2320/0673; G09G 2320/0686; G09G 2340/0407; G09G 3/2074;
(Continued)

(56) References Cited

U.S. PATENT DOCUMENTS 10,373,456 B2 8/2019 Henson et al.
10,388,680 B2 8/2019 Zheng et al.
(Continued)

FOREIGN PATENT DOCUMENTS

CN 103745688 A 4/2014
CN 103886809 A 6/2014
(Continued)

OTHER PUBLICATIONS

Wang et al. "Parameters Analysis of Single Pixel of Active Matrix Array for Amorphous Silicon Thin Film Transistor Organic LED" School of Material Science and Engineering, Shanghai University.
(Continued)

*Primary Examiner* — Ricardo Osorio
(74) *Attorney, Agent, or Firm* — ArentFox Schiff LLP; Michael Fainberg

(57) ABSTRACT

A display substrate, a method for driving the same, a display device, and a high-precision metal mask are provided. The display area includes a first display sub-area in which pixels are distributed at a high density (e.g., a high resolution), and a second display sub-area in which pixels are distributed at a low density (e.g., a low resolution), and a transition display sub-area, with a distribution density of pixels (a resolution) between the distribution density of pixels in the first display sub-area and a distribution density of pixels in the second display sub-area, is arranged between the first display sub-area and the second display sub-area.

18 Claims, 18 Drawing Sheets

Related U.S. Application Data continuation of application No. 17/681,782, filed on Feb. 27, 2022, now Pat. No. 11,562,680, which is a continuation of application No. 16/616,522, filed as application No. PCT/CN2019/078866 on Mar. 20, 2019, now Pat. No. 11,315,469.

(58) Field of Classification Search
CPC ............. G09G 2300/0452; G09G 3/20; H10K 59/121; G09F 9/00
See application file for complete search history.

(56) References Cited

U.S. PATENT DOCUMENTS

| | | | |
|---|---|---|---|
| 10,586,511 B2 | 3/2020 | Yang et al. | |
| 10,606,541 B2 | 3/2020 | Yanagisawa et al. | |
| 11,315,469 B2 * | 4/2022 | Li | G09G 3/20 |
| 11,538,392 B2 | 12/2022 | Li et al. | |
| 11,562,680 B2 | 1/2023 | Li et al. | |
| 2004/0227703 A1 | 11/2004 | Sung | |
| 2005/0046341 A1 | 3/2005 | Ikeda et al. | |
| 2006/0152531 A1 | 7/2006 | Lin | |
| 2008/0088650 A1 | 4/2008 | Chen et al. | |
| 2008/0211757 A1 | 9/2008 | Weng et al. | |
| 2009/0267868 A1 | 10/2009 | Takatani et al. | |
| 2010/0039011 A1 | 2/2010 | Karaki et al. | |
| 2010/0066655 A1 | 3/2010 | Uh et al. | |
| 2012/0092397 A1 | 4/2012 | Deluca | |
| 2014/0285642 A1 | 9/2014 | Hwang et al. | |
| 2015/0029208 A1 | 1/2015 | Kim | |
| 2015/0091953 A1 | 4/2015 | Wu | |
| 2015/0364526 A1 | 12/2015 | Peng et al. | |
| 2015/0371612 A1 | 12/2015 | DeLuca | |
| 2016/0027359 A1 | 1/2016 | Guo et al. | |
| 2016/0078807 A1 | 3/2016 | Sun et al. | |
| 2016/0120005 A1 | 4/2016 | Wu et al. | |
| 2016/0155391 A1 | 6/2016 | Takesue | |
| 2016/0203748 A1 | 7/2016 | Matsueda et al. | |
| 2016/0217593 A1 | 7/2016 | Huang | |
| 2016/0253943 A1 | 9/2016 | Wang | |
| 2016/0267847 A1 | 9/2016 | Chen et al. | |
| 2017/0076654 A1 | 3/2017 | Wang | |
| 2017/0200428 A1 | 7/2017 | Song et al. | |
| 2018/0012566 A1 | 1/2018 | Lin | |
| 2018/0026218 A1 | 1/2018 | Kobayashi | |
| 2018/0040676 A1 | 2/2018 | Hack et al. | |
| 2018/0088260 A1 | 3/2018 | Jin et al. | |
| 2018/0165533 A1 | 6/2018 | Cho et al. | |
| 2018/0350312 A1 | 12/2018 | Cao et al. | |
| 2018/0374426 A1 | 12/2018 | Chen | |
| 2019/0057644 A1 | 2/2019 | Yan | |
| 2019/0212788 A1 | 7/2019 | Kwak et al. | |
| 2019/0251895 A1 | 8/2019 | Zhang et al. | |
| 2019/0310724 A1 | 10/2019 | Yeke Yazdandoost et al. | |
| 2019/0326366 A1 | 10/2019 | Fan | |
| 2019/0333434 A1 | 10/2019 | Chen | |
| 2019/0373166 A1 | 12/2019 | Jia | |
| 2020/0034100 A1 | 1/2020 | Fan | |
| 2020/0043994 A1 | 2/2020 | Chen et al. | |
| 2020/0052059 A1 | 2/2020 | Chen et al. | |
| 2020/0066809 A1 | 2/2020 | Liu | |
| 2020/0175905 A1 | 6/2020 | Yamazaki | |
| 2021/0013277 A1 | 1/2021 | Liu et al. | |
| 2021/0359053 A1 | 11/2021 | Shan et al. | |
| 2023/0078129 A1 * | 3/2023 | Li | H10K 59/121 345/694 |

FOREIGN PATENT DOCUMENTS

| | | |
|---|---|---|
| CN | 104157246 A | 11/2014 |
| CN | 104615395 A | 5/2015 |
| CN | 104658499 A | 5/2015 |
| CN | 104795016 A | 7/2015 |
| CN | 205355055 U | 6/2016 |
| CN | 205845956 U | 12/2016 |
| CN | 106324875 A | 1/2017 |
| CN | 106530994 A | 3/2017 |
| CN | 206194742 U | 5/2017 |
| CN | 106921767 A | 7/2017 |
| CN | 106935615 A | 7/2017 |
| CN | 107422517 A | 12/2017 |
| CN | 107633802 A | 1/2018 |
| CN | 107808627 A | 3/2018 |
| CN | 107819018 A | 3/2018 |
| CN | 107819020 A | 3/2018 |
| CN | 107844247 A | 3/2018 |
| CN | 107920142 A | 4/2018 |
| CN | 107945767 A | 4/2018 |
| CN | 107948354 A | 4/2018 |
| CN | 207264695 A | 4/2018 |
| CN | 207338380 U | 5/2018 |
| CN | 208507679 U | 2/2019 |
| EP | 2843466 A | 3/2015 |
| JP | 2009169070 A | 7/2009 |
| JP | 2011048962 A | 3/2011 |
| JP | 2016195782 A | 11/2016 |
| JP | 2017037274 A | 2/2017 |
| JP | 2017058671 A | 3/2017 |
| JP | 2017533475 A | 11/2017 |
| KR | 20070067962 A | 6/2007 |
| KR | 1020150107883 A | 9/2015 |
| KR | 20170070437 A | 6/2017 |
| KR | 20180097196 A | 8/2018 |
| WO | 2014114178 A1 | 7/2014 |

OTHER PUBLICATIONS

Chinese Office Action for corresponding 201810638716.2 dated May 7, 2020.
Korean Office Action for corresponding 201810638716.2 dated Jun. 17, 2021.
Non Final Office Action from U.S. Appl. No. 16/616,522 dated Sep. 22, 2021.
U.S. Appl. No. 16/615,996 Advisory Action dated Aug. 23, 2022.
U.S. Appl. No. 16/615,996 Final Office Action dated Jun. 8, 2022.
U.S. Appl. No. 17/578,175 Non-Final Office Action dated Jul. 8, 2022.
Korean Office Action for corresponding Application No. 1020207018044 dated Sep. 3, 2022.
EP19821969 ESSR dated Jan. 25, 2022.
EP19822745.6 ESSR dated Jan. 26, 2022.
EP19826064.8 ESSR dated Jan. 25, 2022.
Japanese Office Action for 2019-559752 dated Feb. 1, 2023.
Japanese Office Action for 2019-559768 dated Feb. 1, 2023.
Japanese Office Action for 2019-559769 dated Feb. 10, 2023.
Korean Office Action for corresponding Application No. 1020207017998 dated Mar. 28, 2022.
Korean Office Action for corresponding Application No. 1020207018044 dated Mar. 28, 2022.
Non Final Office Action for corresponding U.S. Appl. No. 16/615,971.
Notice of Allowance for corresponding U.S. Appl. No. 16/615,971.
Non Final Office Action for corresponding U.S. Appl. No. 16/615,996.
Notice of Allowance for corresponding U.S. Appl. No. 16/644,791.
Office Action for corresponding U.S. Appl. No. 16/644,791.
Notice of Allowance for corresponding U.S. Appl. No. 17/681,782.
Office Action for corresponding U.S. Appl. No. 17/731,672.
Notice of Allowance for corresponding U.S. Appl. No. 17/992,458.
Non Final Office Action for corresponding U.S. Appl. No. 15/616,522.
Korean Office Action for corresponding Application No. 1020207018046 dated Jun. 17, 2021.
Corrected Notice of Allowance in U.S. Appl. No. 16/616,522, dated Mar. 25, 2022, 8 pages.
Corrected Notice of Allowance in U.S. Appl. No. 17/992,458, dated Jun. 21, 2023, 2 pages.
Corrected Notice of Allowance in U.S. Appl. No. 17/992,458, dated Aug. 30, 2023, 6 pages.
Final Office Action in U.S. Appl. No. 17/731,672, dated Jan. 31, 2023, 17 pages.

(56) References Cited

OTHER PUBLICATIONS

Final Office Action in U.S. Appl. No. 17/731,672, dated Sep. 1, 2023, 13 pages.
Notice of Allowance in JP2019559752, dated Aug. 22, 2023, 2 pages.
Notice of Allowance in JP2019559769, dated May 23, 2023, 4 pages.
Notice of Allowance in KR1020207017998, dated Apr. 3, 2023, 3 pages.
Notice of Allowance in U.S. Appl. No. 16/615,996, dated Sep. 14, 2022, 8 pages.
Notice of Allowance in U.S. Appl. No. 16/616,522, dated Nov. 30, 2021, 5 pages.
Notice of Allowance in U.S. Appl. No. 17/578,175, dated Nov. 9, 2022, 13 pages.
Notice of Allowance in U.S. Appl. No. 17/681,782, dated Sep. 21, 2022, 27 pages.
Notice of Allowance in U.S. Appl. No. 17/992,458, dated Mar. 15, 2023, 30 pages.
Office Action in EP19821969.3, dated Jun. 6, 2023, 7 pages.
Office Action in EP19822745.6, dated Jun. 6, 2023, 6 pages.
Office Action in EP19826064.8, dated Jun. 12, 2023, 6 pages.
Office Action in JP2019559752, dated May 30, 2023, 3 pages.
Office Action in JP2019559768, dated Jul. 25, 2023, 2 pages.
Office Action in KR1020207017998, dated Jan. 26, 2023, 5 pages.
Office Action in KR1020237016423, dated Jun. 20, 2023 4 pages.
Office Action in U.S. Appl. No. 17/731,672, dated May 10, 2023, 13 pages.
Office Action in U.S. Appl. No. 18/158,254, dated Aug. 30, 2023, 38 pages.

* cited by examiner

DISPLAY SUBSTRATE AND DISPLAY DEVICE

This application is a continuation of U.S. patent application Ser. No. 17/992,458 filed with USPTO on Nov. 22, 2022. The U.S. patent application Ser. No. 17/992,458 is a continuation of U.S. patent application Ser. No. 17/681,782 filed with USPTO on Feb. 27, 2022. The U.S. patent application Ser. No. 17/681,782 is a continuation of U.S. patent application Ser. No. 16/616,522 filed with USPTO on Nov. 25, 2019. The U.S. patent application Ser. No. 16/616,522 is a US National Stage of International Application No. PCT/CN2019/078866, filed Mar. 20, 2019, which claims priority to Chinese Patent Application No. 201810638716.2, filed with the Chinese Patent Office on Jun. 20, 2018, and entitled "Display substrate, Method for driving the same, Display device, and High-precision metal mask", which is hereby incorporated by reference in its entirety.

FIELD

This disclosure relates to the field of display technologies, and particularly to a display substrate, a method for driving the same, a display device, and a high-precision metal mask.

BACKGROUND

As the display technologies are developing, a full-screen panel with a high screen to panel ratio and an ultra-narrow bezel can greatly improve a visual effect for a viewer compared with a general display panel, and thus has been widely favored. At present, a front camera, an earphone, a fingerprint recognition area, a physical button, etc., are typically arranged on the front face of a display device including a full-screen panel, e.g., a mobile phone, to photograph its user, to conduct a video session, to recognize a fingerprint, and to perform other functions. However the arrangement of these indispensable functional elements may hinder a screen-to-body ratio from being improved.

SUMMARY

An embodiment of this disclosure provides a display substrate including a display area. The display area includes: a first display sub-area; a second sub-area; and a transition display sub-area with a preset width, between the first display sub-area and the second display sub-area, wherein the first display sub-area, the transition sub-area, and the second display sub-area form a consecutive display area, wherein a distribution density of pixels in the first display sub-area is higher than a distribution density of pixels in the second display sub-area; a distribution density of pixels in the transition display sub-area is lower than a distribution density of pixels in the first display sub-area, and the distribution density of pixels in the transition display sub-area is higher than the distribution density of pixels in the second display sub-area.

Optionally in the embodiment of this disclosure, at least a part of sides of the second display sub-area coincide with at least a part of sides of the display area, and the other sides of the second display sub-area are surrounded by the transition display sub-area; and the first display sub-area is on the side of the transition display sub-area away from the second display sub-area.

Optionally in the embodiment of this disclosure, the first display sub-area, the transition display sub-area, and the second display sub-area are arranged in the row direction, or the first display sub-area, the transition display sub-area, and the second display sub-area are arranged in the column direction.

Optionally in the embodiment of this disclosure, the display area is substantially rectangular, and the shape of the second display sub-area is one of a round, a drop shape, a rectangle, and a trapezoid.

Optionally in the embodiment of this disclosure, the transition display sub-area is a shape of Chinese character "凹".

Optionally in the embodiment of this disclosure, the transition display sub-area is arranged to surround the second display sub-area, and the first display sub-area is arranged to surround the transition display sub-area.

Optionally in the embodiment of this disclosure, the first display sub-area, the transition display sub-area, and the second display sub-area form a consecutive display area, and the shape of the display area is substantially rectangular.

Optionally in the embodiment of this disclosure, the area of the transition display sub-area is smaller than the area of the second display sub-area, and the area of the second display sub-area is smaller than the area of the first display sub-area.

Optionally in the embodiment of this disclosure, the first display sub-area includes a plurality of first pixel elements and second pixel elements adjacent to each other, wherein each first pixel element includes a first sub-pixel and a second sub-pixel, and each second pixel element includes a third sub-pixel and a second sub-pixel; the second display sub-area includes a plurality of third pixel elements, and each third pixel element includes a first sub-pixel, a second sub-pixel, and a third sub-pixel adjacent to each other; and the transition display sub-area includes a plurality of fourth pixel elements, and each fourth pixel element includes a first sub-pixel, a second sub-pixel, and a third sub-pixel adjacent to each other.

Optionally in the embodiment of this disclosure, the sub-pixels in the second display sub-area are located in same rows as a part of the sub-pixels in the first display sub-area.

Optionally in the embodiment of this disclosure, the sub-pixels in the second display sub-area are located in columns as a part of the sub-pixels in the first display sub-area.

Optionally in the embodiment of this disclosure, the sub-pixels in the transition display sub-area are located in same rows as a part of the sub-pixels in the first display sub-area.

Optionally in the embodiment of this disclosure, the sub-pixels in the transition display sub-area are located in same columns as a part of the sub-pixels in the first display sub-area.

Optionally in the embodiment of this disclosure, the preset width includes the total width of at least one fourth pixel element in a first direction, and the first direction is one of the row direction and the column direction.

Optionally in the embodiment of this disclosure, the preset width includes the total width of a plurality of fourth pixel elements in the first direction, and for same type of sub-pixels in the fourth pixel element, the sub-pixels have a larger light-emitting area when they have a closer distance from the first display sub-area.

Optionally in the embodiment of this disclosure, the sub-pixels in two fourth pixel elements adjacent in the column direction in the transition display sub-area are arranged in opposite orders.

Optionally in the embodiment of this disclosure, the sub-pixels in two fourth pixel elements adjacent in the row direction in the transition display sub-area are arranged in the same order.

Optionally in the embodiment of this disclosure, a light-emitting area of a first sub-pixel in the transition display sub-area is substantially equal to a light-emitting area of a first sub-pixel in the first display sub-area; a light-emitting area of a second sub-pixel in the transition display sub-area is substantially equal to a light-emitting area of a second sub-pixel in the first display sub-area; and a light-emitting area of a third sub-pixel in the transition display sub-area is substantially equal to a light-emitting area of a third sub-pixel in the first display sub-area.

Optionally in the embodiment of this disclosure, a light-emitting area of a first sub-pixel in the second display sub-area is larger than or substantially equal to a light-emitting area of a first sub-pixel in the first display sub-area; a light-emitting area of a second sub-pixel in the second display sub-area is larger than or substantially equal to a light-emitting area of a second sub-pixel in the first display sub-area; and a light-emitting area of a third sub-pixel in the second display sub-area is larger than or substantially equal to a light-emitting area of a third sub-pixel in the first display sub-area.

Optionally in the embodiment of this disclosure, the first sub-pixel, the second sub-pixel, and the third sub-pixel in the fourth pixel element in the transition display sub-area are arranged in the same row.

Optionally in the embodiment of this disclosure, a plurality of third pixel elements are arranged in a matrix in the second display sub-area.

Optionally in the embodiment of this disclosure, a plurality of third pixel elements are arranged in a checkerboard pattern in the second display sub-area.

Optionally in the embodiment of this disclosure, in the third pixel element in the second display sub-area, the first sub-pixel and the third sub-pixel are arranged in the same row, and the second sub-pixel is located in an adjacent row to the row of the first sub-pixel and the third sub-pixel.

Optionally in the embodiment of this disclosure, in the same third pixel element, an orthographic projection of the center of the second sub-pixel on a line connecting the center of the first sub-pixel with the center of the third sub-pixel lies between the center of the first sub-pixel, and the center of the third sub-pixel.

Optionally in the embodiment of this disclosure, the first sub-pixel, the second sub-pixel, and the third sub-pixel in the third pixel element in the second display sub-area are arranged successively in the same row.

Optionally in the embodiment of this disclosure, in the second display sub-area, the sub-pixels in two third pixel elements adjacent in the row direction are arranged in the same order in the row direction, and the sub-pixels in two third pixel elements adjacent in the column direction are arranged in opposite orders in the row direction.

Optionally in the embodiment of this disclosure, the sub-pixels in each third pixel element in the second display sub-area are arranged in the same order.

Optionally in the embodiment of this disclosure, in the second display sub-area, the sub-pixels in each third pixel element in the same column are arranged in the same order; and the sub-pixels in the third pixel elements in two adjacent columns are arranged in opposite orders.

Optionally in the embodiment of this disclosure, in the first display sub-area, the first pixel elements and the second pixel elements are arranged alternately in the column direction, and the first pixel elements and the second pixel elements are arranged alternately in the row direction.

Optionally in the embodiment of this disclosure, the first sub-pixel and the second sub-pixel are arranged in the same row in the first pixel element, and the second sub-pixel and the third sub-pixel in the second pixel element are arranged in the same row; and for the first pixel element and the second pixel element adjacent in the row direction, the second sub-pixel in the first pixel element is not directly adjacent to the second sub-pixel in the second pixel element.

Optionally in the embodiment of this disclosure, a light-emitting area of a first sub-pixel, a light-emitting area of a second sub-pixel, and a light-emitting area of a third sub-pixel are substantially the same in the first display sub-area.

Optionally in the embodiment of this disclosure, the first sub-pixel and the second sub-pixel in the first pixel element are arranged in the same row, and the second sub-pixel and the third sub-pixel in the second pixel element are arranged in different rows and different columns; and the first pixel element and the second pixel element adjacent in the column direction are a pixel group, and in the same pixel group, the second sub-pixel in the first pixel element, and the second sub-pixel in the second pixel element are arranged in the same column.

Optionally in the embodiment of this disclosure, in the first display sub-area, a light-emitting area of a second sub-pixel is smaller than a light-emitting area of a first sub-pixel, and a light-emitting area of a second sub-pixel is smaller than a light-emitting area of a third sub-pixel; and two second sub-pixels in the same pixel group are arranged symmetric in the row direction.

Optionally in the embodiment of this disclosure, in the pixel group, a shape of the first sub-pixel is the same as a shape of the third sub-pixel, and the shape of a combination of two second sub-pixels is substantially the same as the shape of the first sub-pixel.

Optionally in the embodiment of this disclosure, in at least one of the first display sub-area, the transition display sub-area, and the second display sub-area, one type of the sub-pixels among the first sub-pixels and the third sub-pixels have the substantial same shape and the shape of the second sub-pixels in at least one of the second display sub-area and the transition display sub-area is substantially the same as the shape of the second sub-pixels in the first display sub-area.

Optionally in the embodiment of this disclosure, in at least one of the first display sub-area, the transition display sub-area, and the second display sub-area, a shape of the first sub-pixels, a shape of the second sub-pixels, and a shape of the third sub-pixels are substantially the same.

Optionally in the embodiment of this disclosure, the shape of the first sub-pixel is at least one of a rectangle and a hexagon.

Optionally in the embodiment of this disclosure, the sub-pixels in each first pixel element are arranged in the same order, and the sub-pixels in each second pixel element are arranged in the same order, in the first display sub-area.

Correspondingly an embodiment of this disclosure further provides a display device including the display substrate above.

Optionally in the embodiment of this disclosure, the display device further includes a driver configured to drive the display substrate. The driver is configured: to receive raw image data; for each sub-pixel in the first display sub-area, to determine a target grayscale value of the sub-pixel according to an initial grayscale value of a sub-pixel in the raw image data, corresponding to the sub-pixel in the first display sub-area; for each sub-pixel in the transition display sub-area, to determine a target grayscale value of the sub-pixel according to the distribution density of pixels in the transition display sub-area, and an initial grayscale value of a sub-pixel in the raw image data, corresponding to an area including the sub-pixel in the transition display sub-area; for each sub-pixel in the second display sub-area, to determine a target grayscale value of the sub-pixel according to a light-emitting area of the sub-pixel, the distribution density of pixels in the second display sub-area, and an initial grayscale value of a sub-pixel in the raw image data, corresponding to an area including the sub-pixel in the second display sub-area; and to drive the sub-pixels in the display substrate to display at their target grayscale values.

Correspondingly an embodiment of this disclosure further provides a method for driving the display substrate. The method includes: receiving raw image data; for each sub-pixel in the first display sub-area, determining a target grayscale value of the sub-pixel according to an initial grayscale value of a sub-pixel in the raw image data, corresponding to the sub-pixel in the first display sub-area; for each sub-pixel in the transition display sub-area, determining a target grayscale value of the sub-pixel according to the distribution density of pixels in the transition display sub-area, and an initial grayscale value of a sub-pixel in the raw image data, corresponding to an area including the sub-pixel in the transition display sub-area; for each sub-pixel in the second display sub-area, determining a target grayscale value of the sub-pixel according to a light-emitting area of the sub-pixel, the distribution density of pixels in the second display sub-area, and an initial grayscale value of a sub-pixel in the raw image data, corresponding to an area including the sub-pixel in the second display sub-area; and driving the sub-pixels in the display substrate to display at their target grayscale values.

Optionally in the embodiment of this disclosure, determining for each sub-pixel in the first display sub-area the target grayscale value of the sub-pixel includes:

determining a target grayscale value X corresponding to a first sub-pixel in the equation of $$X = \left(\frac{x_1^{Gamma} + x_2^{Gamma}}{2}\right)^{\frac{1}{Gamma}},$$

wherein Gamma represents a gamma value of the display substrate, and x1 and x2 are initial grayscale values of two first sub-pixels in the raw image data, which correspond to the first sub-pixel in the first display sub-area; determining a target grayscale value Y of a second sub-pixel as an initial grayscale value y of a second sub-pixel in the raw image data, corresponding to the second sub-pixel in the first display sub-area; and determining a target grayscale value Z corresponding to a third sub-pixel in the equation of $$Z = \left(\frac{z_1^{Gamma} + z_2^{Gamma}}{2}\right)^{\frac{1}{Gamma}},$$

wherein z1 and z2 are initial grayscale values of two third sub-pixels in the raw image data, which correspond to the third sub-pixel in the first display sub-area.

Optionally in the embodiment of this disclosure, determining for each sub-pixel in the second display sub-area the target grayscale value of the sub-pixel includes: determining the target grayscale value X corresponding to the sub-pixel in the equation of $$X = k*s*\rho\left(\frac{x_1^{Gamma} + x_2^{Gamma} + \ldots + x_n^{Gamma}}{n}\right)^{\frac{1}{Gamma}},$$

wherein n is any integer ranging from 1 to N, N is the number of sub-pixels in the raw image data, which correspond to the sub-pixel in the second display sub-area, Gamma represents a gamma value of the display substrate, s represents the ratio of a light-emitting area of the sub-pixel in the first display sub-area to a light-emitting area of the sub-pixel in the second display sub-area, ρ represents the ratio of the distribution density of pixels in the first display sub-area to the distribution density of pixels in the second display sub-area, k is an error adjustment coefficient, and xn is an initial grayscale value of the n-th sub-pixel in the raw image data, corresponding to the sub-pixel in the second display sub-area.

Optionally in the embodiment of this disclosure, determining for each sub-pixel in the transition display sub-area the target grayscale value of the sub-pixel includes: determining the target grayscale value X corresponding to the sub-pixel in the equation of $$X = k*s*\rho\left(\frac{x_1^{Gamma} + x_2^{Gamma} + \ldots + x_N^{Gamma}}{N}\right)^{\frac{1}{Gamma}},$$

wherein N is the number of sub-pixels in the raw image data, which correspond to the sub-pixel in the transition display sub-area, Gamma represents a gamma value of the display substrate, s represents the ratio of a light-emitting area of the sub-pixel in the first display sub-area to a light-emitting area of the sub-pixel in the second display sub-area, ρ represents the ratio of the distribution density of pixels in the first display sub-area to the distribution density of pixels in the second display sub-area, k is an error adjustment coefficient, and x1 to xN are initial grayscale values of N sub-pixels respectively in the raw image data, corresponding to the sub-pixel in the transition display sub-area.

Optionally in the embodiment of this disclosure, determining for each sub-pixel in the transition display sub-area the target grayscale value of the sub-pixel includes: determining a target grayscale value X corresponding to a first sub-pixel in the equation of $$X = k*s*\rho\left(\frac{x_1^{Gamma} + x_2^{Gamma}}{2}\right)^{\frac{1}{Gamma}},$$

wherein Gamma represents a gamma value of the display substrate, and x1 and x2 represent initial grayscale values of two first sub-pixels in the raw image data, which correspond to the first sub-pixel in the transition display sub-area; determining a target grayscale value Y of a second sub-pixel in the equation of Y=k*s*ρ*y, wherein y represents an initial grayscale value y of a second sub-pixel in the raw image data, corresponding to the second sub-pixel in the transition display sub-area; and determining a target grayscale value Z corresponding to a third sub-pixel in the equation of $$Z = k*s*\rho\left(\frac{z_1^{Gamma} + z_2^{Gamma}}{2}\right)^{\frac{1}{Gamma}},$$

wherein z1 and z2 represent initial grayscale values of two third sub-pixels in the raw image data, which correspond to the third sub-pixel in the transition display sub-area; wherein s represents the ratio of a light-emitting area of the sub-pixel in the first display sub-area to a light-emitting area of the sub-pixel in the second display sub-area, ρ represents the ratio of the distribution density of pixels in the first display sub-area to the distribution density of pixels in the second display sub-area, and k is an error adjustment coefficient.

Correspondingly an embodiment of this disclosure further provides a high-precision metal mask for fabricating the display substrate above, wherein the high-precision metal mask includes a plurality of opening areas corresponding in shape and position to the first sub-pixels, the second sub-pixels, or the third sub-pixels.

DETAILED DESCRIPTION

Figure 1A:
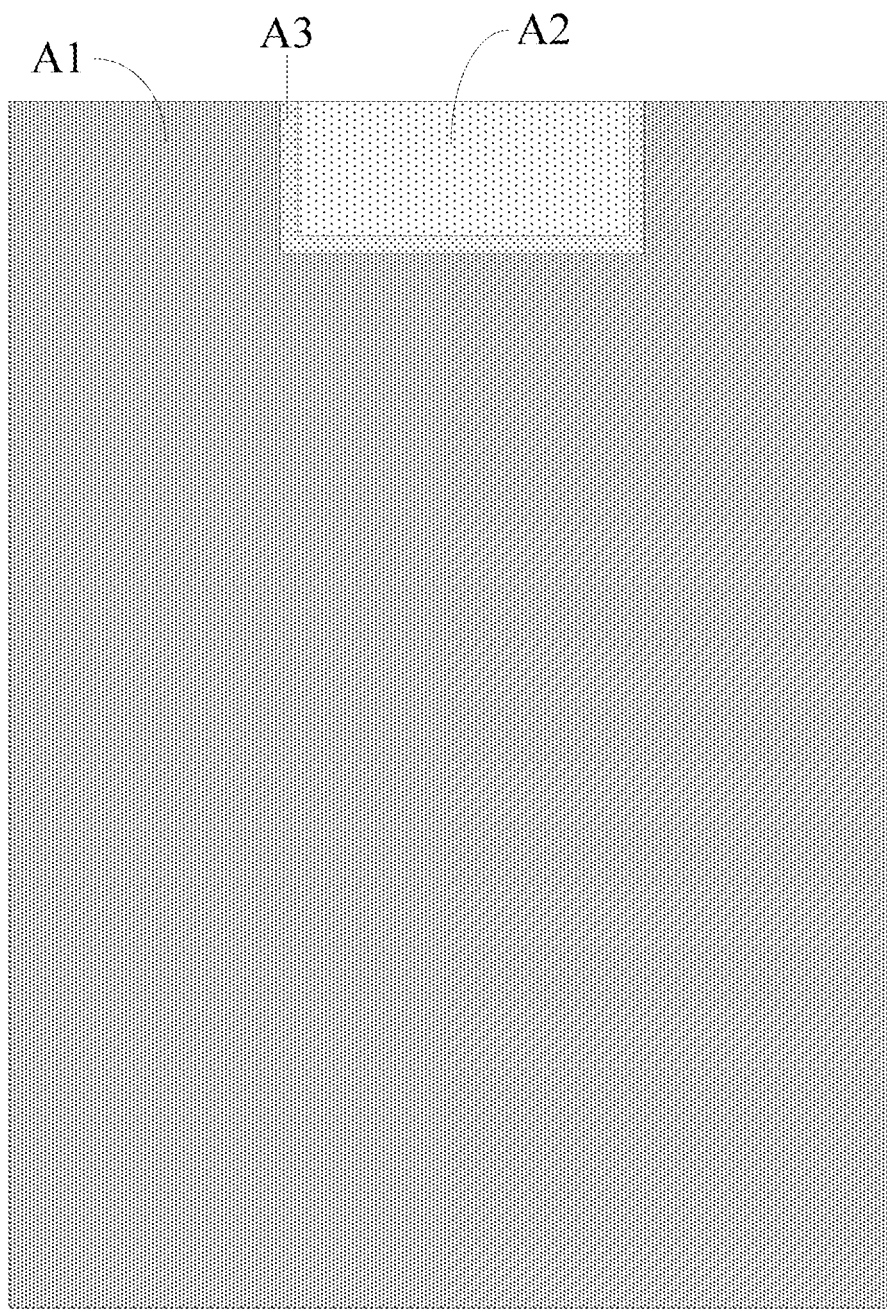
FIG. 1A is a first schematic structural diagram of a display substrate according to an embodiment of this disclosure.

The embodiments of this disclosure provide a display substrate, a method for driving the same, a display device, and a high-precision metal mask. In order to make the objects, technical solutions, and advantages of this disclosure more apparent, this disclosure will be described below in further details with reference to the drawings. Apparently the embodiments to be described are only a part but not all of the embodiments of this disclosure. Based upon the embodiments here of this disclosure, all the other embodiments which can occur to those ordinarily skilled in the art without any inventive effort shall come into the scope of this disclosure as claimed.

The shapes and the sizes of respective components in the drawings are not intended to reflect any real proportion, but only intended to illustrate the disclosure of this application.

Figure 1B:
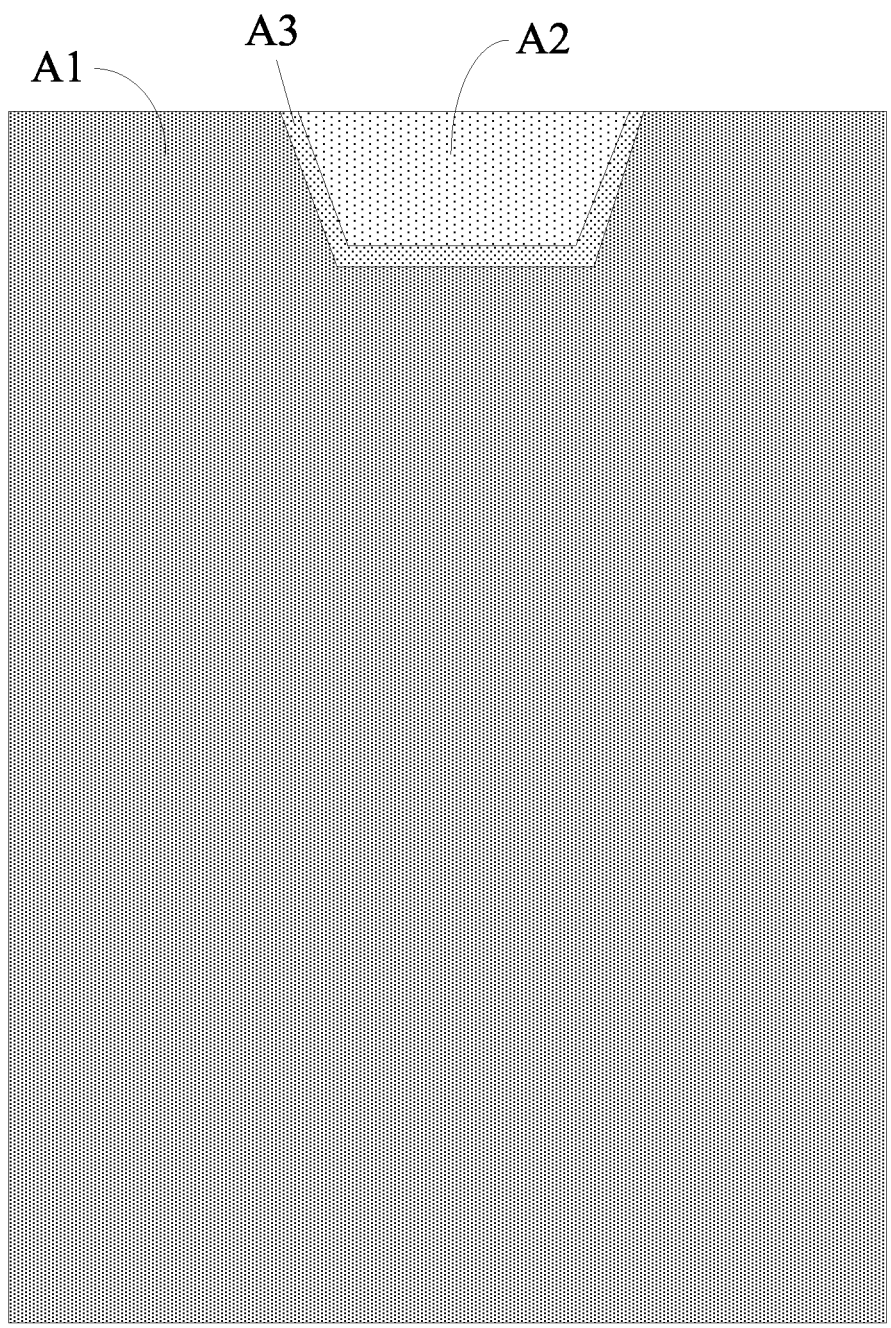
FIG. 1B is a second schematic structural diagram of the display substrate according to the embodiment of this disclosure.
Figure 1C:
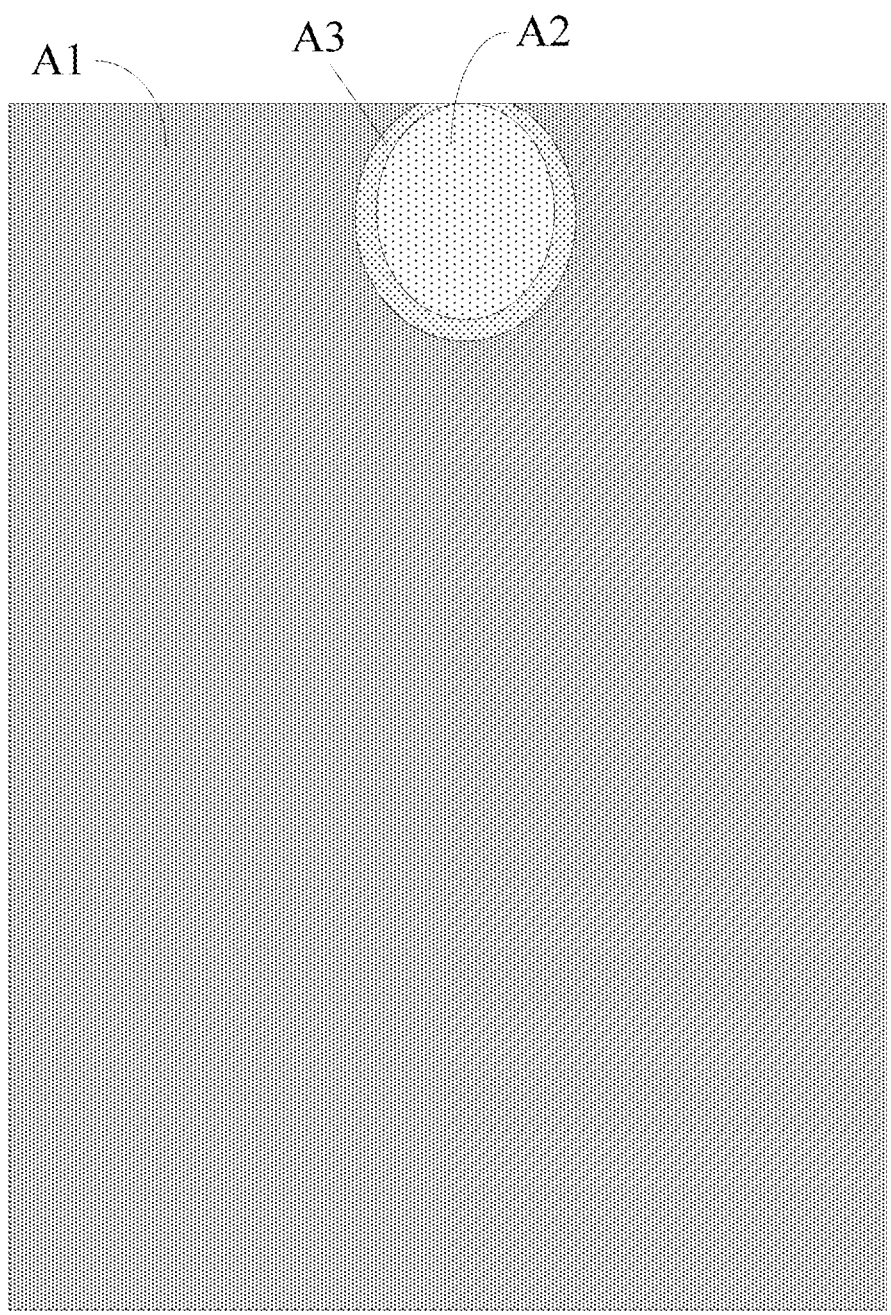
FIG. 1C is a third schematic structural diagram of the display substrate according to the embodiment of this disclosure.
Figure 1D:
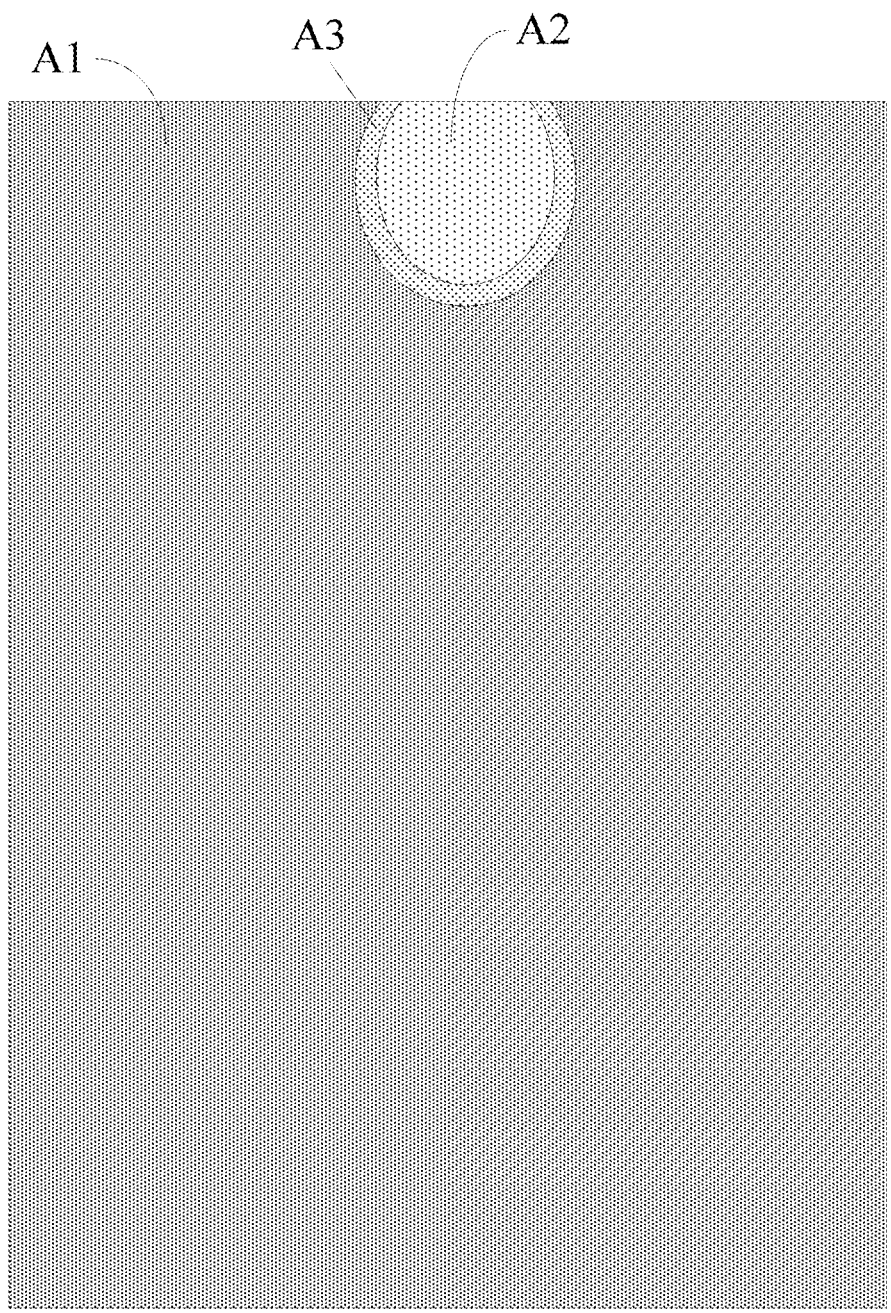
FIG. 1D is a fourth schematic structural diagram of the display substrate according to the embodiment of this disclosure.
Figure 1E:
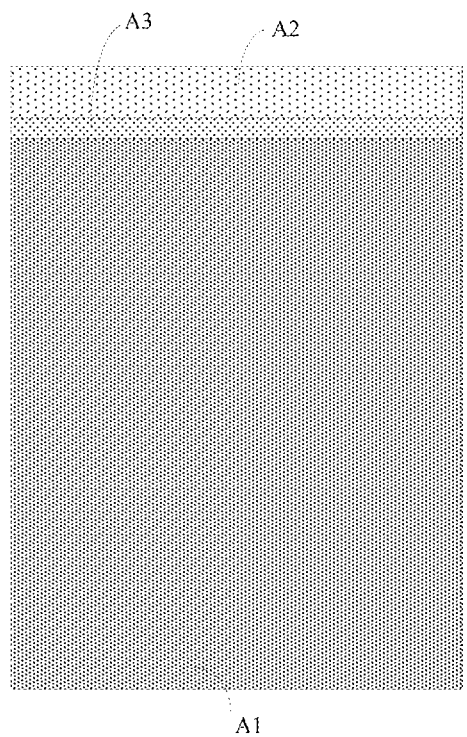
FIG. 1E is a fifth schematic structural diagram of the display substrate according to the embodiment of this disclosure.

In a display substrate according to an embodiment of the disclosure, as illustrated in FIG. 1a and FIG. 1E, a display area of the display substrate includes a first display sub-area A1, a second sub-area A2, and a transition display sub-area A3 with a preset width, between the first display sub-area A1 and the second display sub-area A2.

Furthermore a distribution density of pixels in the first display sub-area A1 is higher than a distribution density of pixels in the second display sub-area A2, a distribution density of pixels in the transition display sub-area A3 is lower than a distribution density of pixels in the first display sub-area A1, and the distribution density of pixels in the transition display sub-area A3 is higher than the distribution density of pixels in the second display sub-area A2.

In the display substrate according to the embodiment of this disclosure, the display area includes the first display sub-area in which pixels are distributed at a high density (e.g., a high resolution), and the second display sub-area in which pixels are distributed at a low density (e.g., a low resolution). Since the distribution density of pixels in the second display sub-area is lower, a camera and other elements can be arranged in the second display sub-display area, that is, the distribution density of the local pixels can be lowered to thereby improve the transmittivity of a screen so as to improve a screen-to-body ratio of the display substrate. The transition display sub-area, in which the distribution density of pixels (the resolution) is between the distribution density of pixels in the first display sub-area and the distribution density of pixels in the second display sub-area, is arranged between the first display sub-area and the second display sub-area, so that brightness in the first display sub-area can transition to brightness in the second display sub-area through the transition display sub-area to thereby avoid a dark strip from occurring at the interface between the first display sub-area and the second display sub-area.

It shall be noted that the distribution density of pixels refers to the number of pixels arranged uniformly in a unit area. If there are a large number of pixels arranged in a unit area, then there may be a high distribution density of pixels, and thus a high resolution; and if there are a small number of pixels arranged in a unit area, then there may be a low distribution density of pixels, and thus a low resolution.

In a specific implementation, if the transition display sub-area is not arranged, then since the distribution density of pixels in the second display sub-area is lower than the distribution density of pixels in the first display sub-area, when an image is displayed, there may be such an apparent difference in brightness between the second display sub-area and the first display sub-area that there may be an apparent dark strip visible to human eyes, at the interface between the first display sub-area and the second display sub-area. In order to alleviate the dark strip, in the embodiment of this disclosure, the transition display sub-area is arranged between the first display sub-area and the second display sub-area to thereby reduce the difference in brightness at the interface between the first display sub-area and the second display sub-area so as to alleviate the dark strip.

In a specific implementation, in the display substrate according to the embodiment of this disclosure, the number of second display sub-areas may be one or more; and the first display sub-area may be a consecutive area, or may be an inconsecutive area, dependent upon a real application environment, although the embodiment of the invention will not be limited thereto.

Furthermore in the embodiment of this disclosure, the distribution density of pixels is calculated in the equation of $$\rho = \frac{\sqrt{x^2+y^2}}{S},$$

where ρ represents the distribution density of pixels, x represents the number of display pixels in the row direction, y represents the number of display pixels in the column direction, and S represents the area of a screen.

In a specific implementation, in the display substrate according to the embodiment of this disclosure, as illustrated in FIG. 1A to FIG. 1F, at least a part of sides of the second display sub-area A2 coincide with at least a part of sides of the display area, and the other sides of the second display sub-area A2 are surrounded by the transition display sub-area A3, and the first display sub-area A1 is located on the side of the transition display sub-area A3 away from the second display sub-area A2, so that the second display sub-area A2 and the transition display sub-area A3 can be arranged at the edge of the display area. Optionally the display area is substantially rectangular, and for example, all corners of the display area are right-angles, so the display area is rectangular. Alternatively all corners of the display area can be arced angles, so the shape of the display area is substantially rectangular. Furthermore in a specific implementation, the shape of the second display sub-area A2 can be arranged as a regular shape, and as illustrated in FIG. 1A, for example, the second display sub-area A2 can be arranged as a rectangle. The corners of the rectangle can alternatively be arced angles. As illustrated in FIG. 1B, the second display sub-area A2 can be arranged as a trapezoid. The corners of the trapezoid can alternatively be arced corners. As illustrated in FIG. 1C, the second display sub-area A2 can be arranged as a round. Of course, the shape of the second display sub-area A2 can be arranged as an irregular shape. As illustrated in FIG. 1D, the second display sub-area A2 can be arranged as a drop shape. Of course, the shape of the second display sub-area can be designed according to the shape of a component arranged in the second display sub-area in a real application, although the embodiment of this disclosure will not be limited thereto.

In a specific implementation, in the display substrate according to the embodiment of this disclosure, as illustrated in FIG. 1E, the first display sub-area A1, the transition display sub-area A3, and the second display sub-area A2 can be arranged in the row direction, where the second display sub-area A2, the transition display sub-area A3, and the first display sub-area A1 can be arranged successively from the top to the bottom. In this way, a sensor, e.g., a sensor for recognizing a human face (e.g., an infrared sensor, etc.), can be further arranged in the second display sub-area A2.

Figure 1F:
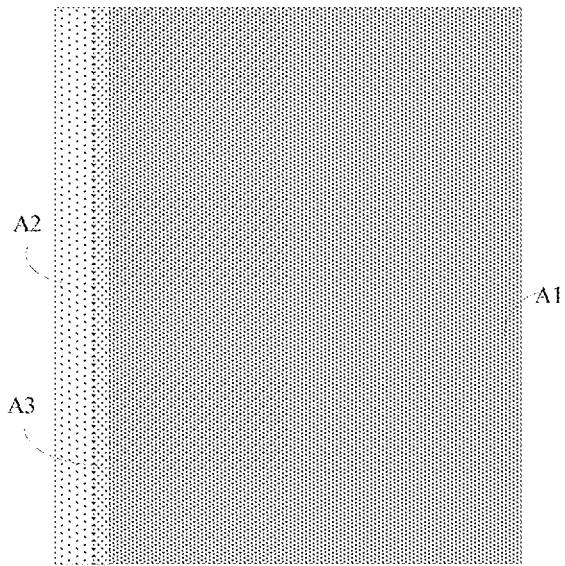
FIG. 1F is a sixth schematic structural diagram of the display substrate according to the embodiment of this disclosure.
Figure 1G:
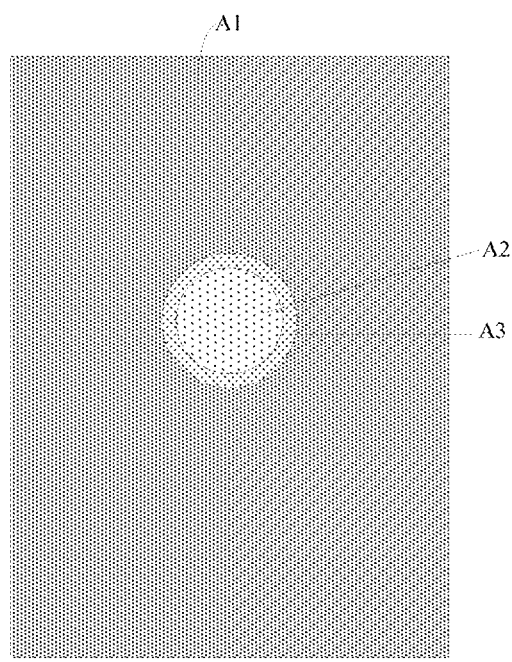
FIG. 1G is a seventh schematic structural diagram of the display substrate according to the embodiment of this disclosure.
Figure 1H:
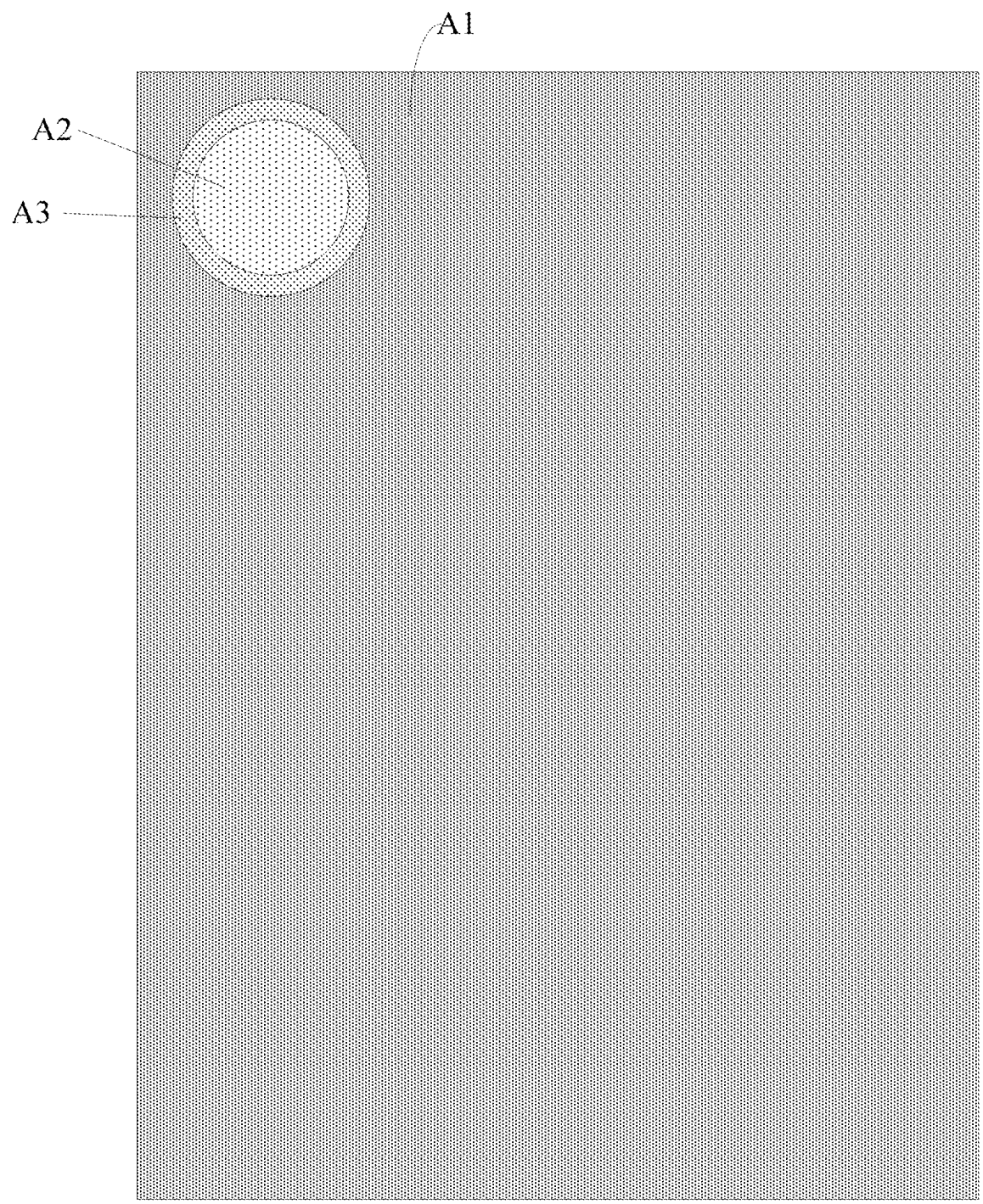
FIG. 1H is an eighth schematic structural diagram of the display substrate according to the embodiment of this disclosure.

In a specific implementation, in the display substrate according to the embodiment of this disclosure, as illustrated in FIG. 1F, the first display sub-area A1, the transition display sub-area A3, and the second display sub-area A2 can be arranged in the column direction, where the second display sub-area A2, the transition display sub-area A3, and the first display sub-area A1 can be arranged successively from the left to the right. In this way, a sensor, e.g., a sensor for recognizing a human face (e.g., an infrared sensor, etc.), can be further arranged in the second display sub-area A2.

In a specific implementation, in the display substrate according to the embodiment of this disclosure, as illustrated in FIG. 1A to FIG. 1D, the transition display sub-area A3 can be arranged like the Chinese character '凵'. As illustrated in FIG. 1A and FIG. 1B, for example, the transition display sub-area A3 includes six sides, which include three sides of the transition display sub-area A3 adjacent to sides of the second display sub-area, and three sides of the transition display sub-area A3 adjacent to the first display sub-area, so that the second display sub-area, the transition display sub-area, and the first display sub-area are in complementary shapes to thereby constitute a rectangle.

In a specific implementation, in the display substrate according to the embodiment of this disclosure, as illustrated in FIG. 1E and FIG. 1F, the transition display sub-area A3 is arranged to surround the second display sub-area A2, and the first display sub-area A1 is arranged to surround the transition display sub-area A3, so that the second display sub-area A2 and the transition display sub-area A3 can be arranged inside the display area. Optionally in a specific implementation, the shape of the second display sub-area A2 can be a round or an ellipse, so the shape of the transition display sub-area A3 can be a ring. Of course, the shape of the second display sub-area can be designed according to the shape of a component arranged in the second display sub-area in a real application, although the embodiment of this disclosure will not be limited thereto.

In a specific implementation, in the display substrate according to the embodiment of this disclosure, as illustrated in FIG. 1A to FIG. 1F, the first display sub-area A1, the transition display sub-area A3, and the second display sub-area A2 form a consecutive display area, and the shape of the display area is substantially rectangular.

It shall be noted that in the embodiment of the disclosure, top corners of the rectangle can be right-angle, or can be arced angle, although the embodiment of this disclosure will not be limited thereto.

In a specific implementation, in the display substrate according to the embodiment of this disclosure, a relative positional relationship between the first display sub-area and the second display sub-area, and their shapes will not be limited to any specific relative positional relationship and shapes, but can be arranged according to a screen design of the display substrate. For a mobile phone, for example, the second display sub-area A2 can be arranged at the top in the middle of the first display sub-area A1 as illustrated in FIG. 1A to FIG. 1D, or the second display sub-area A2 can be arranged at the top of the first display sub-area A1 as illustrated in FIG. 1E, or the second display sub-area A2 can be arranged on the left side of the first display sub-area A1 as illustrated in FIG. 1F, although the embodiment of this disclosure will not be limited thereto.

In a specific implementation, in the display substrate according to the embodiment of this disclosure, as illustrated in FIG. 1A to FIG. 1F, the area of the transition display sub-area A3 can be smaller than the area of the second display sub-area A2, and the area of the second display sub-area A2 can be smaller than the area of the first display sub-area A1. Of course, the shape of the second display sub-area can be designed according to the shape of a component arranged in the second display sub-area in a real application, although the embodiment of this disclosure will not be limited thereto.

In a specific implementation, in the display substrate according to the embodiment of this disclosure, the distribution density of pixels in the second display sub-area is determined according to a component arranged in the second display sub-area, although the embodiment of the invention will not be limited thereto. For example, a camera is arranged in the second display sub-area, and if the distribution density of pixels is too high, then a good display effect can be guaranteed, but a definition of photographing may be degraded, or if the distribution density of pixels is too low, then a high definition of photographing can be guaranteed, but the display effect may be degraded. In a specific implementation, there is such an attainable resolution of the existing display substrate that the distribution density of pixels in the second display sub-area is generally no lower than the distribution density of pixels in the first display sub-area by a factor of ¼. For example, the distribution density of pixels in the second display sub-area is ½, ⅓, or ¼ of the distribution density of pixels in the first display sub-area. Of course, if the resolution of the display substrate is made higher, then the ratio of the distribution density of pixels in the second display sub-area to the distribution density in the first display sub-area may be set smaller, although the embodiment of the invention will not be limited thereto.

Pixel elements are generally arranged in the display area, and each pixel element includes a plurality of sub-pixels; and the pixel in the embodiment of this disclosure may refer to a combination of sub-pixels which can display an image at a pixel point independently, and for example, the pixel may refer to a pixel element. Optionally in the display substrate according to the embodiment of this disclosure, as illustrated in FIG. 2 to FIG. 9, the first display sub-area A1 includes a plurality of first pixel elements 10 and second pixel elements 20 arranged adjacent to each other, where each first pixel element 10 includes a first sub-pixel 1 and a second sub-pixel 2, and each second pixel element 20 includes a third sub-pixel 3 and a second sub-pixel 2. When an image is displayed, the number of pixels in the first display sub-area A1 is equal to the sum of the number of first pixel elements 10, and the number of second pixel elements 20. That is, the pixels are arranged in a Pantile pattern in the first display sub-area A1, and the image can be displayed at the pixel elements at a higher resolution than a physical resolution by borrowing the sub-pixels in their adjacent pixel elements.

The second display sub-area A2 includes a plurality of third pixel elements 30, and each third pixel element 30 includes a first sub-pixel 1, a second sub-pixel 2, and a third sub-pixel 3 adjacent to each other. When an image is displayed, the number of pixels in the second display sub-area A2 is equal to the number of third pixel elements 30, that is, a physical resolution of the pixels in the second display sub-area A2 is a display definition thereof.

The transition display sub-area A3 includes a plurality of fourth pixel elements 40, and each fourth pixel element 40 includes a first sub-pixel 1, a second sub-pixel 2, and a third sub-pixel 3 adjacent to each other. When an image is displayed, the number of pixels in the transition display sub-area A3 is equal to the number of fourth pixel element 40, that is, a physical resolution of the pixels in the transition display sub-area A3 is a display definition thereof.

In a specific implementation, the first sub-pixels, the second sub-pixels, and the third sub-pixels are generally one of red, green, and blue sub-pixels respectively. Optionally in the display substrate according to the embodiment of this disclosure, the second sub-pixels are green sub-pixels, the first sub-pixels are red or blue sub-pixels, and the third sub-pixels are blue or red sub-pixels.

It shall be noted that each pixel element can be a combination of sub-pixels at a pixel point, and for example, can be a combination of two, three, four or more of red, green, and blue sub-pixels, or each pixel element can be a combination of repeating elements or pixels, e.g., a combination of red, green, and blue sub-pixels.

In a specific implementation, in the display substrate according to the embodiment of this disclosure, two adjacent sub-pixels refer to two sub-pixels between which there is not any other sub-pixel.

It shall be noted that in the display substrate according to the embodiment of this disclosure, since there is a limited space at the edge of a display sub-area, the arrangement of sub-pixels in the first display sub-area, the arrangement of sub-pixels in the second display sub-area, and the arrangement of sub-pixels in the transition display sub-area generally refer to the arrangements of sub-pixels inside the display sub-areas, and there may be a different arrangement of some sub-pixels at the edge of the display sub-area, although the embodiment of this disclosure will not be limited thereto.

In a specific implementation, in the display substrate according to the embodiment of this disclosure, the arrangement pattern of the third pixel element may or may not be the same as the arrangement pattern of the fourth pixel element, although the embodiment of this disclosure will not be limited thereto.

Optionally in the display substrate according to the embodiment of this disclosure, there may be the same arrangement pattern for the third pixel element and the fourth pixel element. This can facilitate both a patterning process and an overall layout of the display substrate.

Optionally in the display substrate according to the embodiment of this disclosure, as illustrated in FIG. 2 to FIG. 5, the sub-pixels in the second display sub-area A2 can be located in the same rows as a part of the sub-pixels in the first display sub-area A1, so that the sub-pixels in the second display sub-area A2 correspond to the sub-pixels in the first display sub-area A1 in the row direction instead of being arranged in a different row or column from the latter sub-pixels. In this way, the display substrate is fabricated in such a way that equivalently a part of the sub-pixels in the second display sub-area in a sub-pixel mask originally arranged regularly throughout the display area are removed, thus making it relatively easy to perform a fabrication process.

Optionally in the display substrate according to the embodiment of this disclosure, as illustrated in FIG. 2 to FIG. 9, the sub-pixels in the second display sub-area A2 can be located in the same columns as a part of the sub-pixels in the first display sub-area A1 so that the sub-pixels in the second display sub-area A2 correspond to the sub-pixels in the first display sub-area A1 in the column direction instead of being arranged in a different row or column from the latter sub-pixels. In this way, the display substrate is fabricated in such a way that equivalently a part of the sub-pixels in the second display sub-area A2 in a sub-pixel mask originally arranged regularly throughout the display area are removed, thus making it relatively easy to perform a fabrication process.

Optionally in the display substrate according to the embodiment of this disclosure, as illustrated in FIG. 2 to FIG. 5, the sub-pixels in the transition display sub-area A3 can be located in the same rows as a part of the sub-pixels in the first display sub-area A1 so that the sub-pixels in the transition display sub-area A3 correspond to the sub-pixels in the first display sub-area A1 in the row direction instead of being arranged in a different row or column from the latter sub-pixels. In this way, the display substrate is fabricated in such a way that equivalently a part of the sub-pixels in the transition display sub-area A3 in a sub-pixel mask originally arranged regularly throughout the display area are removed, thus making it relatively easy to perform a fabrication process.

Optionally in the display substrate according to the embodiment of this disclosure, as illustrated in FIG. 2 to FIG. 9, the sub-pixels in the transition display sub-area A3 can be located in the same columns as a part of the sub-pixels in the first display sub-area A1 so that the sub-pixels in the transition display sub-area A3 correspond to the sub-pixels in the first display sub-area A1 in the column direction instead of being arranged in a different row or column from the latter sub-pixels. In this way, the display substrate is fabricated in such a way that equivalently a part of the sub-pixels in the transition display sub-area A3 in a sub-pixel mask originally arranged regularly throughout the display area are removed, thus making it relatively easy to perform a fabrication process.

Figure 2:
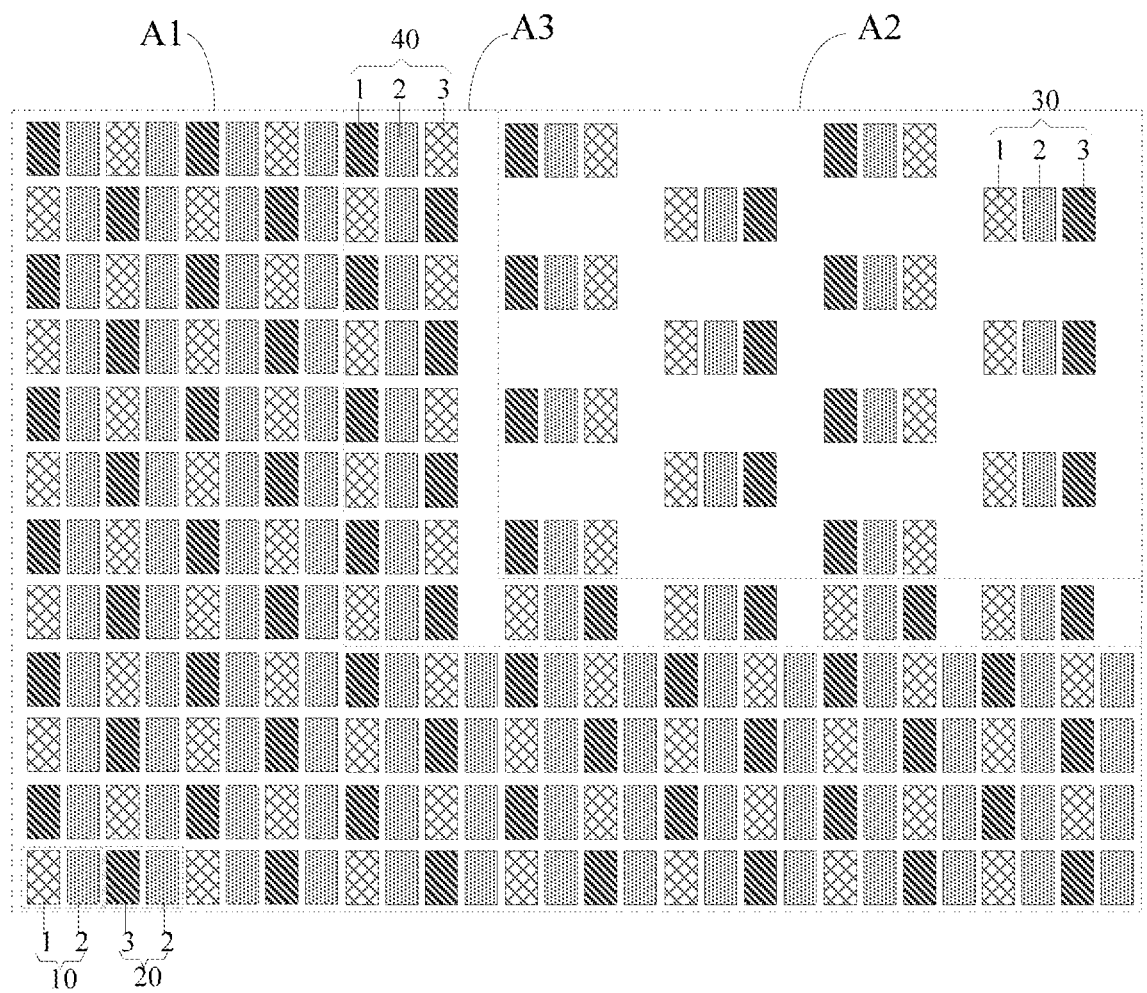
FIG. 2 is a first schematic partial structural diagram of the display substrate according to the embodiment of this disclosure.

Optionally the sub-pixels in the second display sub-area A2 and the transition display sub-area A3 correspond to the sub-pixels in the first display sub-area A1 in the row or column direction, instead of being arranged in a different row or column from the latter sub-pixels. In this way, the display substrate is fabricated in such a way that equivalently a part of the sub-pixels in the second display sub-area A2, and a part of the sub-pixels in the transition display sub-area A3 in a sub-pixel mask originally arranged regularly throughout the display area are removed, thus making it relatively easy to perform a fabrication process. As illustrated in FIG. 2, for example, equivalently a half of the second sub-pixels 2 in the transition display sub-area A3 are removed as compared with the first display sub-are A1, so the resolution thereof is ½ of the resolution of the first display sub-area A1; and equivalently ¾ of the second sub-pixels 2 in the second display sub-area A2 are removed as compared with the first display sub-are A1, so the resolution thereof is ¼ of the resolution of the first display sub-area A1.

In a specific implementation, the width of the transition display sub-area, i.e., a preset width, can be designed according to the display effect, and a screen size of the display substrate. Optionally the preset width can include the width of at least one fourth pixel element in a first direction, where the first direction can be one of the row direction and the column direction. For example, the preset width can include the width of at least one fourth pixel element in the row direction. In a specific implementation, the transition display sub-area is arranged at the cost of the resolution of the display substrate, so the preset width is generally made not too large. The preset width being a width of one fourth pixel element in the row direction generally can suffice for the technical effect to be attained by this disclosure. Of course, when there is a large screen size of the display substrate, the preset width can alternatively be made larger, and for example, the preset width can be the total width of a plurality of fourth pixel elements in the row direction, although the embodiment of the invention will not be limited thereto. It shall be noted that the preset width can include the total width of at least two fourth pixel elements in the row direction, and the gaps between these four pixel elements.

In a specific implementation, the preset width can alternatively include the width of at least one fourth pixel element in the column direction. Furthermore the preset width is generally made not too large. The preset width being a width of one fourth pixel element in the column direction generally can suffice for the technical effect to be attained by this disclosure. Of course, when there is a large screen size of the display substrate, the preset width can alternatively be made larger, and for example, the preset width can be the total width of a plurality of fourth pixel elements in the column direction, although the embodiment of the invention will not be limited thereto. It shall be noted that the preset width can include the total width of at least one fourth pixel element in the column direction, and the gaps between these four pixel elements.

Figure 6:
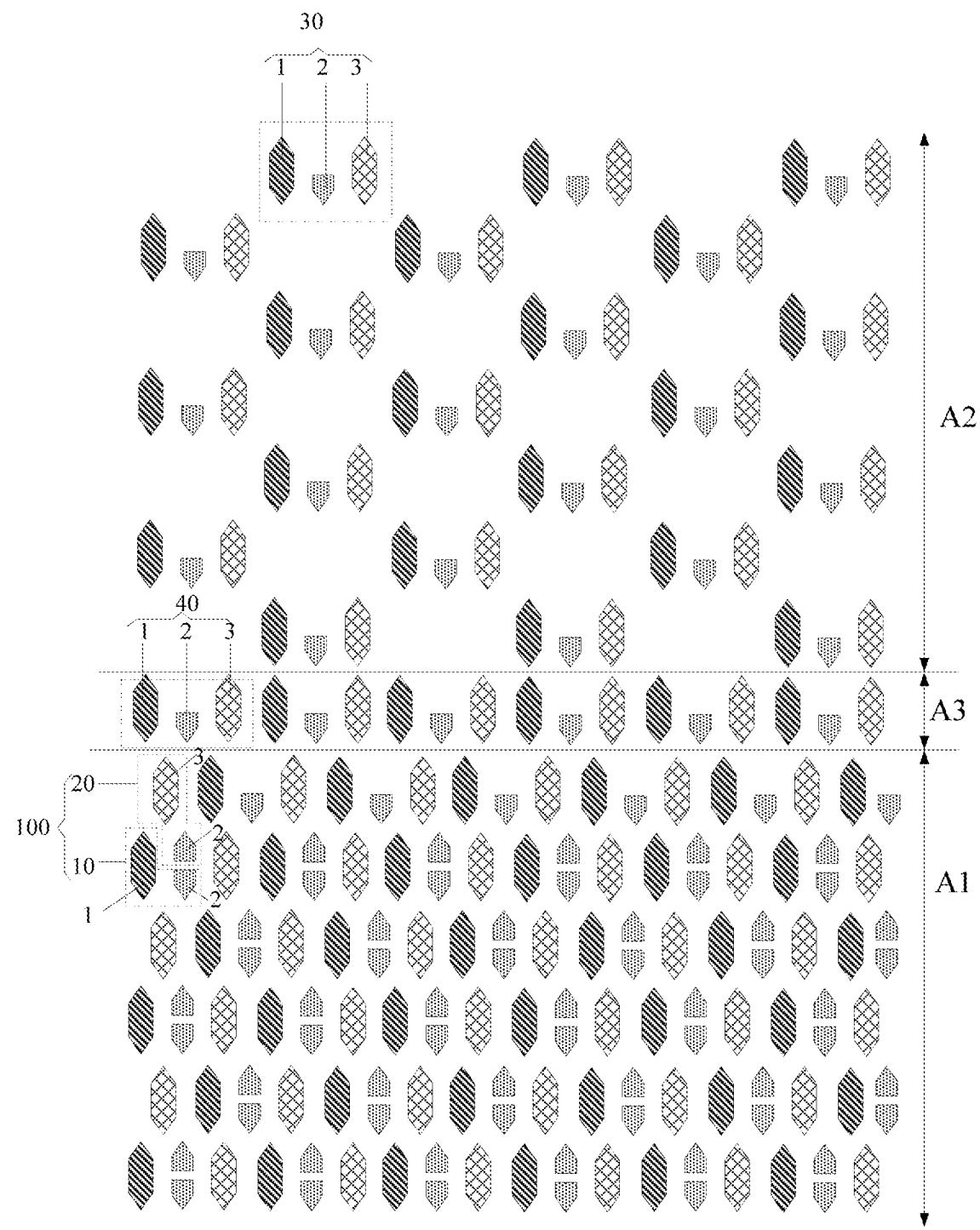
FIG. 6 is a fifth schematic partial structural diagram of the display substrate according to the embodiment of this disclosure.

It shall be noted that in the display substrate according to the embodiment of this disclosure, the preset width can include at least one of a preset width in the row direction, and a preset width in the column direction, where the preset width in the row direction can be the width of a fourth pixel element in the row direction, and the preset width in the column direction can be the width of a fourth pixel element in the column direction. As illustrated in FIG. 2 to FIG. 5, for example, the preset width of the transition display sub-area A3 in the row direction is the width of a fourth pixel element 40 in the row direction, and the preset width of the transition display sub-area A3 in the column direction is the width of a fourth pixel element 40 in the column direction. As illustrated in FIG. 6, the preset width of the transition display sub-area A3 in the column direction is the width of a fourth pixel element 40 in the column direction.

In a specific implementation, in order to enable an image to be displayed normally in the second display sub-area, the distribution density of pixels in the second display sub-area is generally made not too small. Optionally the distribution density of pixels in the second display sub-area can be set to ¼ of the distribution density of pixels in the first display sub-area so that the distribution density of pixels in the transition display sub-area can be set to ½ of the distribution density of pixels in the first display sub-area.

Of course, in a specific implementation, when there is a significant difference in distribution density of pixels between the first display sub-area and the second display sub-area, the distribution density of pixels in the transition display sub-area can decrease gradually in the direction from the first display sub-area to the second display sub-area.

In a specific implementation, from the perspective of a fabrication process, in the display substrate according to the embodiment of this disclosure, a light-emitting area of a sub-pixel in the transition display sub-area A3 is equal to a light-emitting area of a sub-pixel in the first display sub-area. That is, in the display substrate according to the embodiment of this disclosure, a light-emitting area of a first sub-pixel 1 in the transition display sub-area A3 is substantially equal to a light-emitting area of a first sub-pixel 1 in the first display sub-area A1, a light-emitting area of a second sub-pixel 2 in the transition display sub-area A3 is substantially equal to a light-emitting area of a second sub-pixel 2 in the first display sub-area A1, and a light-emitting area of a third sub-pixel 3 in the transition display sub-area A3 is substantially equal to a light-emitting area of a third sub-pixel 3 in the first display sub-area A1, as illustrated in FIG. 2 to FIG. 9. In a specific implementation, there may be some error due to a limiting process condition or another factor, e.g., an arrangement of wires or via-holes, in a real process, so the relationship between the light-emitting areas of the respective sub-pixels can substantially satisfy the condition above without departing from the scope of this disclosure.

Figure 10:
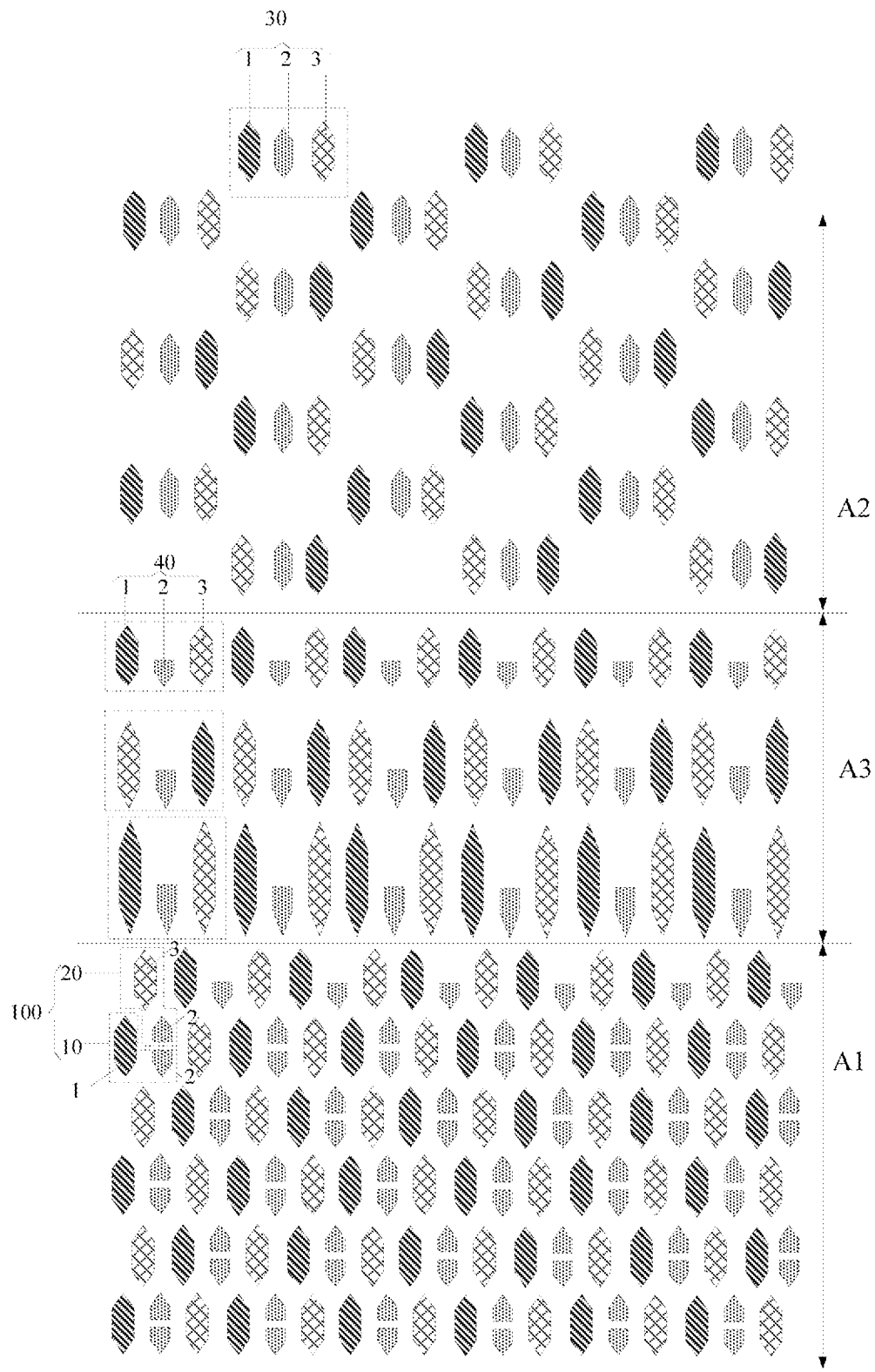
FIG. 10 is a ninth schematic partial structural diagram of the display substrate according to the embodiment of this disclosure.

In a specific implementation, in order to alleviate a dark strip at the interface between the first display sub-area and the second display sub-area, as illustrated in FIG. 10, when the preset width includes the total width of a plurality of fourth pixel elements in the display substrate according to the embodiment of this disclosure, there is a larger light-emitting area of the same kind of sub-pixel in a fourth pixel element 40 at a shorter distance from the first display sub-area A1. In this way, the light-emitting area of the sub-pixel can be adjusted so that the brightness in the transition display sub-area decreases gradually in the direction from the first display sub-area to the second display sub-area. As illustrated in FIG. 10, for example, the preset width includes the total width of three fourth pixel elements, and taking the first sub-pixels 1 as an example, the third row of fourth pixel elements 40 is at the shortest distance from the first display sub-area A1, so there is the largest light-emitting area of the first sub-pixels 1 in the third row of fourth pixel elements. The second row of fourth pixel elements 40 is at a longer distance from the first display sub-area A1, so there is a smaller light-emitting area of the first sub-pixels 1 in the second row of fourth pixel elements 40 than the light-emitting area of the first sub-pixels 1 in the first row of fourth pixel elements 40. The first row of fourth pixel elements 40 has a longest distance from the first display sub-area A1, so there is the smallest light-emitting area of the first sub-pixels 1 in the first row of fourth pixel elements 40. Furthermore the second sub-pixels 2 and the third sub-pixels 3 can be arranged alike, so a repeated description thereof will be omitted here.

In a specific implementation, in the display substrate according to the embodiment of this disclosure, as illustrated in FIG. 10, in the transition display sub-area A3, the sub-pixels in two fourth pixel elements 40 adjacent in the column direction are arranged in opposite orders. Taking the first column as an example, the first sub-pixel, the second sub-pixel, and the third sub-pixel in the first and third rows of fourth pixel elements 40 respectively are arranged successively from the left to the right, and the third sub-pixel, the second sub-pixel, and the first sub-pixel in the second row of fourth pixel elements 40 are arranged successively from the left to the right.

In a specific implementation, in the display substrate according to the embodiment of this disclosure, as illustrated in FIG. 10, in the transition display sub-area A3, the sub-pixels in two fourth pixel elements 40 adjacent in the row direction are arranged in the same order. Taking the first row as an example, the first sub-pixels, the second sub-pixels, and the third sub-pixels in the first and second columns of fourth pixel elements 40 respectively are arranged successively from the left to the right. Furthermore the sub-pixels in the respective fourth pixel elements 40 in each row can be arranged in the same order. Taking the first row as an example, the first sub-pixels, the second sub-pixels, and the third sub-pixels in the first to sixth columns of fourth pixel elements 40 respectively are arranged successively from the left to the right.

In a specific implementation, in the display substrate according to the embodiment of this disclosure, the first sub-pixels, the second sub-pixels, and the third sub-pixels in the fourth pixel elements can be arranged in the same arrangement pattern as the arrangement pattern of the first sub-pixels, the second sub-pixels, and the third sub-pixels arranged adjacent to each other in the first display area to thereby facilitate a patterning process. Alike in a specific implementation, in the display substrate according to the embodiment of this disclosure, the first sub-pixels, the second sub-pixels, and the third sub-pixels in the third pixel elements can be arranged in the same arrangement pattern as the arrangement pattern of the first sub-pixels, the second sub-pixels, and the third sub-pixels arranged adjacent to each other in the first display area to thereby facilitate a patterning process.

Optionally in the display substrate according to the embodiment of this disclosure, as illustrated in FIG. 2 to FIG. 10, in the transition display sub-area A3, the first sub-pixels 1, the second sub-pixels 2, and the third sub-pixels 3 in the fourth pixel elements 40 are arranged in the same row, or they can be arranged adjacent successively in the same column, although the embodiment of this disclosure will not be limited thereto.

Optionally in the display substrate according to the embodiment of this disclosure, a light-emitting area of a first sub-pixel in the second display sub-area can be larger than or substantially equal to a light-emitting area of a first sub-pixel in the first display sub-area. A light-emitting area of a second sub-pixel in the second display sub-area can be larger than or substantially equal to a light-emitting area of a second sub-pixel in the first display sub-area. A light-emitting area of a third sub-pixel in the second display sub-area can be larger than or substantially equal to a light-emitting area of a third sub-pixel in the first display sub-area.

Figure 9:
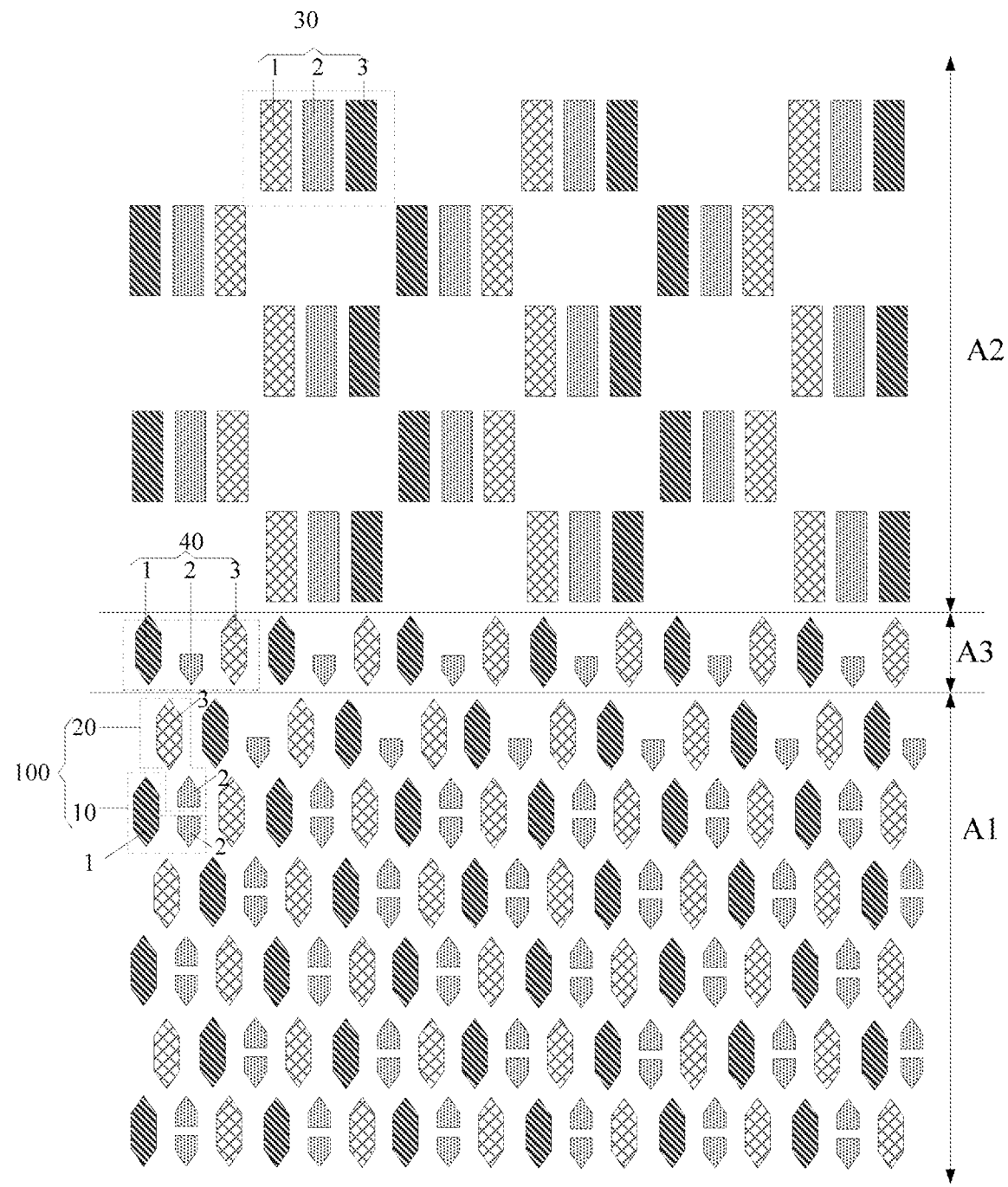
FIG. 9 is an eighth schematic partial structural diagram of the display substrate according to the embodiment of this disclosure.

In a specific implementation, the distribution density of pixels in the second display sub-area is lower than the distribution density of pixels in the first display sub-area, so when an image is displayed, brightness in the second distribution density of pixels is lower than brightness in the first distribution density of pixels so that there may be an apparent dark strip visible to human eyes, at the interface between the first display sub-area and the second display sub-area. Optionally in order to alleviate the dark strip, in the display substrate according to the embodiment of this disclosure, as illustrated in FIG. 9, a light-emitting area of a first sub-pixel 1 in the second display sub-area A2 can be larger than a light-emitting area of a first sub-pixel 1 in the first display sub-area A1, a light-emitting area of a second sub-pixel 2 in the second display sub-area A2 can be larger than a light-emitting area of a second sub-pixel 2 in the first display sub-area A1, and a light-emitting area of a third sub-pixel 1 in the second display sub-area A2 can be larger than a light-emitting area of a third sub-pixel 1 in the first display sub-area A1. That is, the light-emitting areas of the sub-pixels in the second display sub-area A2 can be increased to thereby lower the difference in brightness between the second display sub-area A2 and the first display sub-area A1 so as to alleviate the dark strip at the interface between the second display sub-area A2 and the first display sub-area A1.

Of course, in the display substrate according to the embodiment of this disclosure, as illustrated in FIG. 2 to FIG. 8, a light-emitting area of a first sub-pixel 1 in the second display sub-area A2 can be substantially equal to a light-emitting area of a first sub-pixel 1 in the first display sub-area A1, and a light-emitting area of a third sub-pixel 3 in the second display sub-area A2 can be substantially equal to a light-emitting area of a third sub-pixel 3 in the first display sub-area A1. As illustrated in FIG. 2 to FIG. 5, a light-emitting area of a second sub-pixel 2 in the second display sub-area A2 can be substantially equal to a light-emitting area of a second sub-pixel 2 in the first display sub-area A1. Of course, the relationship between the light-emitting areas above can be determined according to a real application environment, although the embodiment of this disclosure will not be limited thereto.

Figure 3:
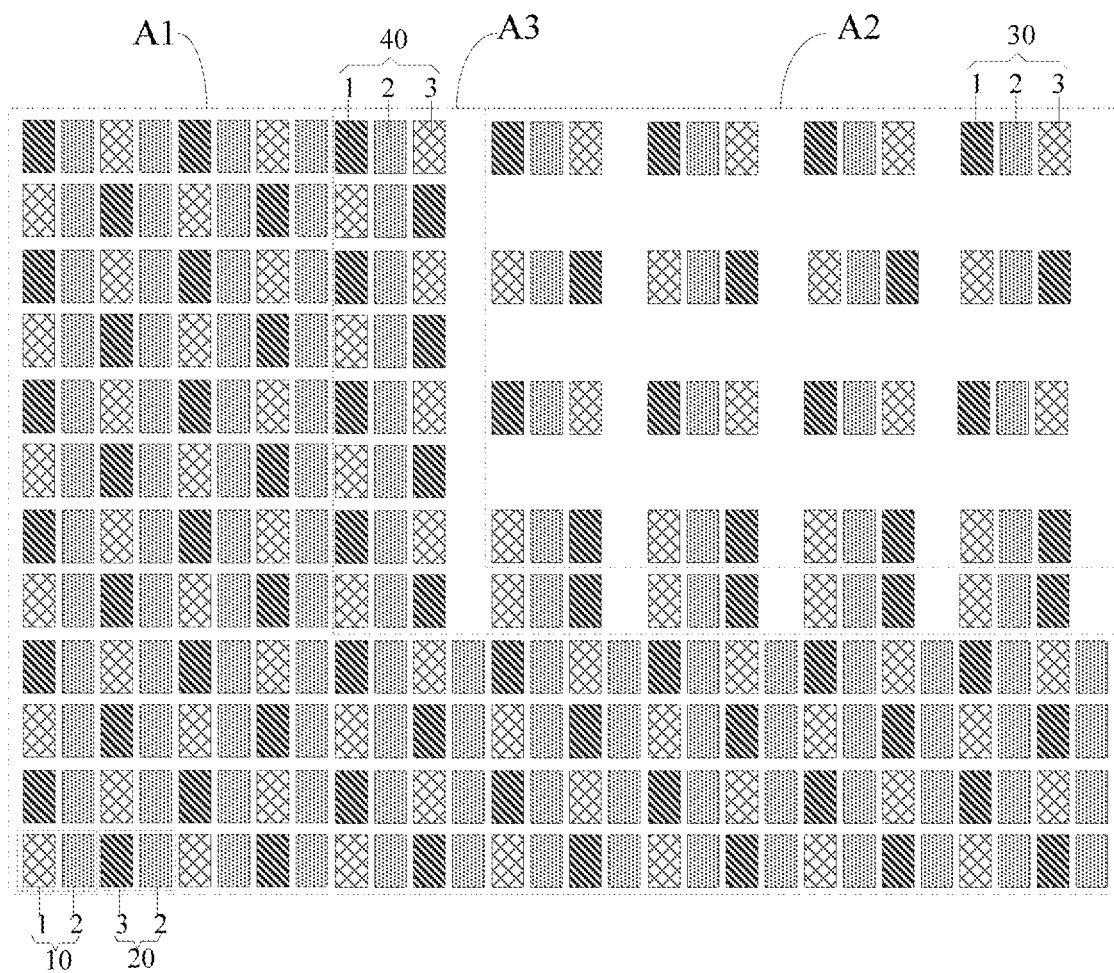
FIG. 3 is a second schematic partial structural diagram of the display substrate according to the embodiment of this disclosure.
Figure 4:
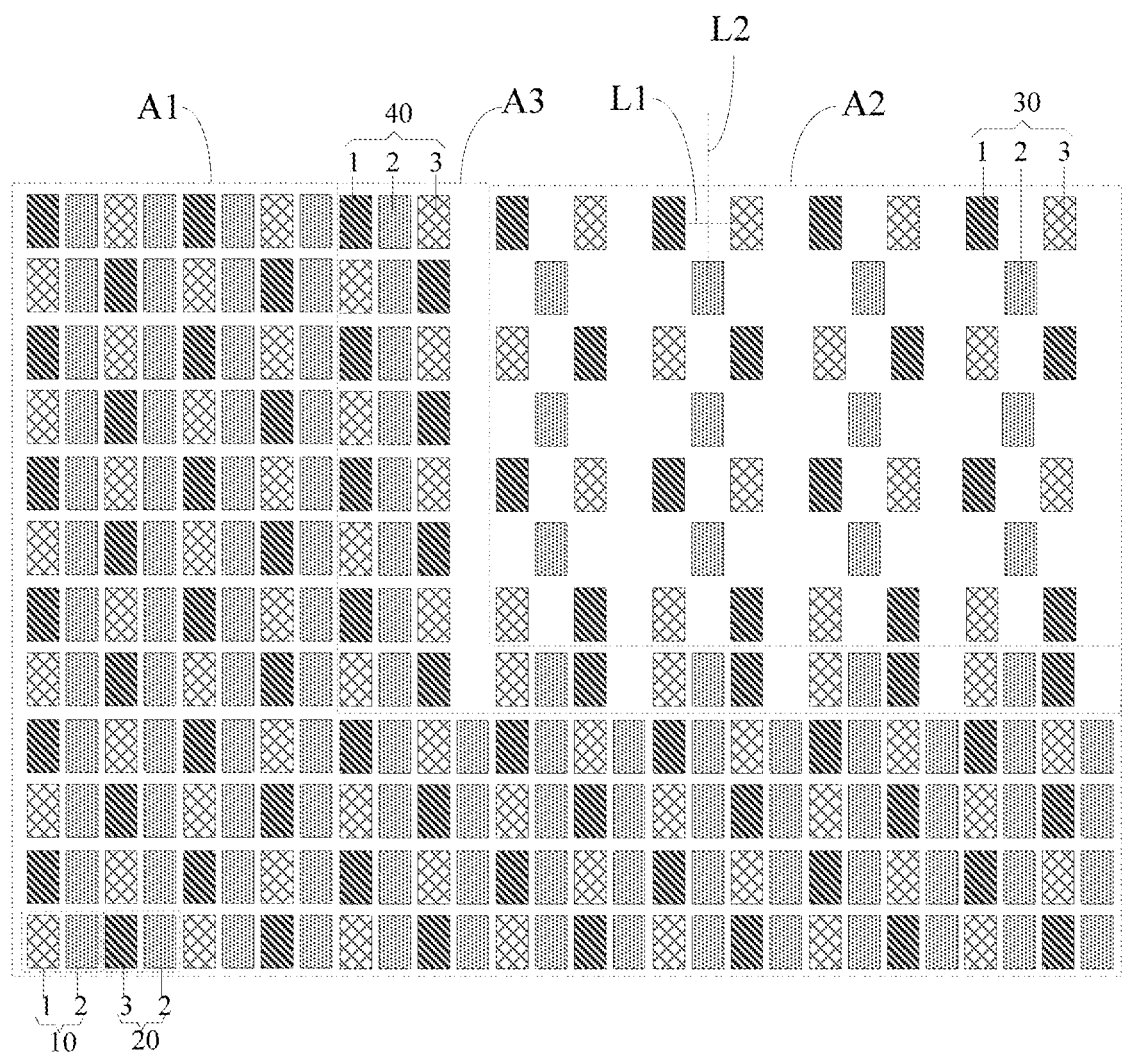
FIG. 4 is a third schematic partial structural diagram of the display substrate according to the embodiment of this disclosure.
Figure 5:
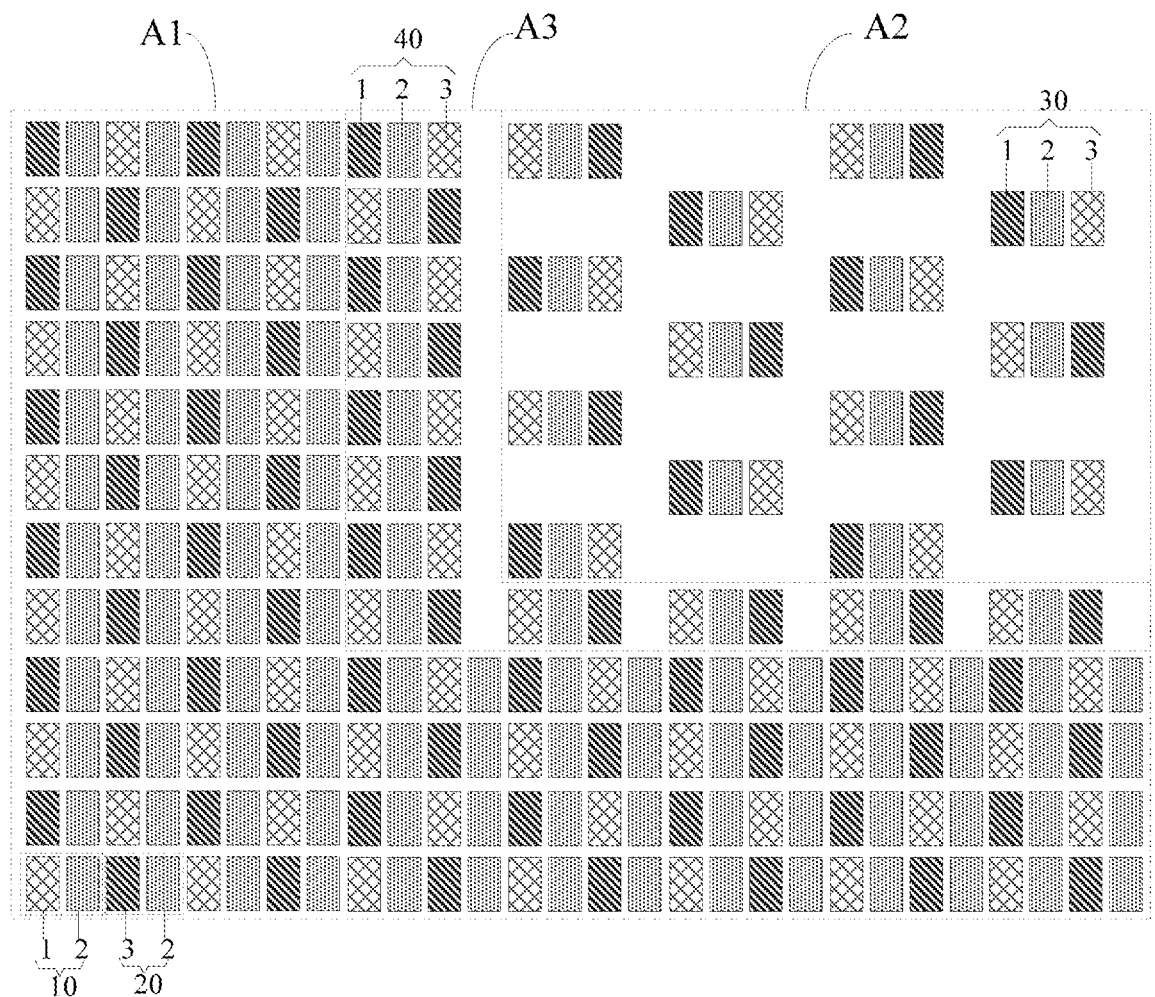
FIG. 5 is a fourth schematic partial structural diagram of the display substrate according to the embodiment of this disclosure.

In a specific implementation, in the display substrate according to the embodiment of this disclosure, as illustrated in FIG. 3 and FIG. 4, a plurality of third pixel elements 30 can be arranged in a matrix in the second display sub-area A2.

Optionally in the display substrate according to the embodiment of this disclosure, as illustrated in FIG. 2, and FIG. 5 to FIG. 10, a plurality of third pixel elements 30 can be arranged in a checkerboard pattern in the second display sub-area A2. That is, the plurality of third pixel elements 30 are arranged in every other column in the row direction, and in every other row in the column direction. As illustrated in FIG. 6, for example, the third pixel elements 30 are arranged at the even column positions in an odd row, and the third pixel elements 30 are arranged at the odd column positions in an even row, so that the third pixel elements 30 are distributed uniformly in the row direction and the column direction to thereby guarantee uniform brightness in the second display sub-area A2. Furthermore this can also improve the transmittivity of gaps between the pixels to thereby facilitate photographing by a camera below the screen, and also facilitate sensing of an ambient signal by a sensor. Alternatively the third pixel elements 30 can be arranged at the odd column positions in an odd row, and the third pixel elements 30 are arranged at the even column positions in an even row, so that there is some spacing between any two third pixel elements, where the spacing can be the length of at least one third pixel element in the row direction, and the length of at least one third pixel element in the column direction, for example, although the embodiment of this disclosure will not be limited thereto.

Optionally in the display substrate according to the embodiment of this disclosure, as illustrated in FIG. 4, in the third pixel element 30 in the second display sub-area A2, the first sub-pixel 1 and the third sub-pixel 3 are arranged in the same row, and the second sub-pixel 2 is located in an adjacent row to the row of the first sub-pixel 1 and the third sub-pixel 3. That is, the second sub-pixel 2 and the first sub-pixel 1 are arranged in different rows. For example, the first sub-pixel 1 and the third sub-pixel 3 in the same third pixel element 30 are located in the first row, and the second sub-pixel 2 is located in the second row, so that lines connecting the centers of the first sub-pixel, the second sub-pixel, and the third sub-pixel in the same third pixel element 30 form a triangle to thereby avoid traverse bright and dark strips from occurring in the second display sub-area A2.

It shall be noted that in the display substrate according to the embodiment of this disclosure, the center of a sub-pixel refers to the center of a light-emitting area of the sub-pixel. Taking an OLED display panel as an example, a sub-pixel generally includes an anode layer, a light-emitting layer, and a cathode layer structured in a stack, and when an image is displayed, the light-emitting region corresponding to the stack structure is a light-emitting region of the sub-pixel, so that the area occupied by the light-emitting region is a light-emitting area. Of course, the light-emitting area can alternatively be an area occupied by an opening region defined by the pixel definition layer, for example, although the embodiment of this disclosure will not be limited thereto.

Optionally in the display substrate according to the embodiment of this disclosure, as illustrated in FIG. 4, in the same third pixel element 30, an orthographic projection of the center of the second sub-pixel 2 on the line L1 connecting the center of the first sub-pixel 1 with the center of the third sub-pixel 3 lies between the center of the first sub-pixel 1 and the center of the third sub-pixel 3. For example, the orthographic projection of the center of the second sub-pixel 2 on the line L1 connecting the center of the first sub-pixel 1 with the center of the third sub-pixel 3 lies on the intersection between the connecting line L1 and the straight line L2. In this way, the distance between the center of the second sub-pixel 2 and the center of the first sub-pixel 1 in the third pixel element 30 can be equal to the distance between the center of the second sub-pixel 2 and the center of the third sub-pixel 3, so that these three sub-pixels are arranged in an isosceles triangle pattern to thereby avoid vertical bright and dark strips from occurring in the second display sub-area A2.

In a specific implementation, the distance between the center of the second sub-pixel 2 and the center of the first sub-pixel 1 may not be exactly equal to the distance between the center of the second sub-pixel 2 and the center of the third sub-pixel 3, and there may be some error due to a limiting process condition or another factor, e.g., an arrangement of wires or via-holes, in a real process, so the shapes and the positions of the respective sub-pixels, and their relative positional relationship can substantially satisfy the condition above without departing from the scope of this disclosure.

Optionally in the display substrate according to the embodiment of this disclosure, as illustrated in FIG. 2, FIG. 3, and FIG. 5 to FIG. 10, the first sub-pixel 1, the second sub-pixel 2, and the third sub-pixel 3 in the third pixel element 30 are arranged in the same row or column in the second display sub-area A2, although the embodiment of this disclosure will not be limited thereto.

Of course, in a specific implementation, in the display substrate according to the embodiment of this disclosure, as illustrated in FIG. 2, FIG. 3, and FIG. 5 to FIG. 10, the first sub-pixel 1, the second sub-pixel 2, and the third sub-pixel 3 in the third pixel element 30 are arranged successively in the same row. For example, the first sub-pixel 1, the second sub-pixel 2, and the third sub-pixel 3 in the third pixel element 30 are arranged successively from the left to the right, or they can alternatively be arranged successively in the same column, although the embodiment of this disclosure will not be limited thereto. Furthermore, as illustrated in FIG. 2, FIG. 3, and FIG. 5 to FIG. 10, the first sub-pixel 1, the second sub-pixel 2, and the third sub-pixel 3 in the third pixel element 30 are arranged adjacent successively in the same row or column, although the embodiment of this disclosure will not be limited thereto.

Optionally in the display substrate according to the embodiment of this disclosure, as illustrated in FIG. 3 to FIG. 5, and FIG. 7 to FIG. 10, in the second display sub-area A2, the sub-pixels in two third pixel elements 30 adjacent in the row direction are arranged in the same order in the row direction, and the sub-pixels in two third pixel elements 30 adjacent in the column direction are arranged in opposite orders in the row direction, so that the first sub-pixels 1 and the third sub-pixels 3 can be arranged alternately in the column direction in the second display sub-area A2 to thereby avoid a color cast from occurring in the column direction. It shall be noted that the sub-pixels in two third pixel elements 30 adjacent in the row direction being arranged in the same order in the row direction refers to that the first sub-pixels 1, the second sub-pixels 2, and the third sub-pixels 3 in the two adjacent third pixel elements 30 are arranged in the same order. As illustrated in FIG. 3, for example, taking the first row of third pixel elements 30 as an example, the first sub-pixel 1, the second sub-pixel 2, and the third sub-pixel 3 in each of two adjacent third pixel elements 30 are arranged successively from the left to the right in the row direction. As illustrated in FIG. 4, for example, taking the first row of third pixel elements 30 as an example, the first sub-pixel 1, the second sub-pixel 2, and the third sub-pixel 3 in each of two adjacent third pixel elements 30 are arranged in an upside-down triangle pattern in the row direction.

In a specific implementation, in the display substrate according to the embodiment of this disclosure, the sub-pixels in each third pixel element 30 in the second display sub-area A2 can be arranged in the same order as illustrated in FIG. 6. As illustrated in FIG. 6, for example, the first sub-pixel 1, the second sub-pixel 2, and the third sub-pixel 3 in each third pixel element 30 are arranged successively from the left to the right.

In a specific implementation, in the display substrate according to the embodiment of this disclosure, as illustrated in FIG. 2 and FIG. 9, the sub-pixels in each third pixel element 30 in the same column are arranged in the same order, and the sub-pixels in the third pixel elements 30 in two adjacent columns are arranged in opposite orders in the second display sub-area A2. As illustrated in FIG. 2, for example, the third sub-pixel 3, the second sub-pixel 2, and the first sub-pixel 1 in each third pixel element 30 in the first and third columns are arranged successively from the left to the right, and the first sub-pixel 1, the second sub-pixel 2, and the third sub-pixel 3 in each third pixel element 30 in the second and fourth columns are arranged successively from the left to the right.

Optionally in the display substrate according to the embodiment of this disclosure, as illustrated in FIG. 2 to FIG. 10, the sub-pixels in each first pixel element 10 are arranged in the same order, and the sub-pixels in each second pixel element 20 are arranged in the same order, in the first display sub-area. As illustrated in FIG. 2 to FIG. 5, for example, the first sub-pixel 1 and the second sub-pixel 2 in each first pixel element 10 are arranged successively from the left to the right, and the third sub-pixel 3 and the second sub-pixel 2 in each second pixel element 20 are arranged successively from the left to the right. As illustrated in FIG. 6 to FIG. 10, the first sub-pixel 1 and the second sub-pixel 2 in each first pixel element 10 are arranged successively from the left to the right, and the third sub-pixel 3 and the second sub-pixel 2 in each second pixel element 20 are arranged successively from the top left to the bottom right.

Optionally in the display substrate according to the embodiment of this disclosure, as illustrated in FIG. 2 to FIG. 10, the first pixel elements 10 and the second pixel elements 20 in the first display sub-area A1 can be arranged in any Pantile pattern, although the embodiment of this disclosure will not be limited thereto.

Optionally in the display substrate according to the embodiment of this disclosure, as illustrated in FIG. 2 to FIG. 10, the first pixel elements 10 and the second pixel elements 20 are arranged alternately in the column direction, and the first pixel elements 10 and the second pixel elements 20 are arranged alternately in the row direction, in the first sub-area A1.

Optionally in the display substrate according to the embodiment of this disclosure, as illustrated in FIG. 2 to FIG. 5, the second sub-pixel 2 and the first sub-pixel 1 in the first pixel element 10 are arranged in the same row, and the second sub-pixel 2 and the third sub-pixel 3 in the second pixel element 20 are arranged in the same row. For the first pixel element 10 and the second pixel element 20 adjacent in the row direction, the second sub-pixel 2 in the first pixel element 10 is not directly adjacent to the second sub-pixel 2 in the second pixel element 20. For example, for the first pixel element 10 and the second pixel element 20 adjacent in the row direction, the first sub-pixel 1 and the second sub-pixel 2 in the first pixel element 10 are arranged successively from the left to the right, and the third sub-pixel 3 and the second sub-pixel 2 in the second pixel element 20 are arranged successively from the left to the right.

Optionally in the display substrate according to the embodiment of this disclosure, as illustrated in FIG. 2 to FIG. 5, a light-emitting area of a first sub-pixel 1, a light-emitting area of a second sub-pixel 2, and a light-emitting area of a third sub-pixel 3 can be substantially the same in the first display sub-area A2.

Optionally in the display substrate according to the embodiment of this disclosure, as illustrated in FIG. 6 to FIG. 10, the second sub-pixel 2 and the first sub-pixel 1 in the first pixel element 10 are arranged in the same row, and the second sub-pixel 2 and the third sub-pixel 3 in the second pixel element 20 are arranged in different rows and different columns, in the first display sub-area A1; and the two sub-pixels 2 in the first pixel element 10 and the second pixel element 20 adjacent in the column direction are not adjacent to each other. Furthermore the first pixel element 10 and the second pixel element 20 adjacent in the column direction are a pixel group 100, and in the same pixel group 100, the second sub-pixel 2 in the first pixel element 10 and the second sub-pixel 2 in the second pixel element 20 are arranged in the same column, that is, two adjacent rows of pixel elements are staggered in the column direction by half a column.

Optionally in the display substrate according to the embodiment of this disclosure, as illustrated in FIG. 6 to FIG. 10, a light-emitting area of a second sub-pixel 2 is smaller than a light-emitting area of a first sub-pixel 1, and a light-emitting area of a second sub-pixel 2 is smaller than a light-emitting area of a third sub-pixel 3, in the first display sub-area A1. This is because the number of first sub-pixels is the same as the number of third sub-pixels 3, and the number of second sub-pixels 2 is twice the number of first sub-pixels 1, in the first display sub-area A1, the light-emitting area of a second sub-pixel 2 can be made smaller. Furthermore two second sub-pixels 2 in the same pixel group 100 are arranged symmetric in the row direction, that is, two second sub-pixels 2 in the same pixel group 100 are arranged in a mirror pattern. Furthermore in the first display sub-area A1, when the second sub-pixels 2 are green sub-pixels, the total light-emitting area of two second sub-pixels 2 is smaller than a light-emitting area of a first sub-pixel 1, and the total light-emitting area of two second sub-pixels 2 is smaller than a light-emitting area of a third sub-pixel 3, because the green sub-pixels have higher light-emission efficiency than that of the sub-pixels in the other colors.

Specifically in the display substrate according to the embodiment of this disclosure, the shapes of the first sub-pixels, the second sub-pixels, and the third sub-pixels in the first display sub-area will not be limited to any specific shapes, and may be regular or irregular shapes. In a specific implementation, a regular shape is generally easy to form from the perspective of a process.

Specifically in the display substrate according to the embodiment of this disclosure, the shapes of the first sub-pixels, the second sub-pixels, and the third sub-pixels in the transition display sub-area will not be limited to any specific shapes, and may be regular or irregular shapes. In a particular implementation, a regular shape is generally easy to form from the perspective of a process.

Specifically in the display substrate according to the embodiment of this disclosure, the shapes of the first sub-pixels, the second sub-pixels, and the third sub-pixels in the second display sub-area will not be limited to any specific shapes, and may be regular or irregular shapes. In a specific implementation, a regular shape is generally easy to form from the perspective of a process.

Optionally in the display substrate according to the embodiment of this disclosure, as illustrated in FIG. 2 to FIG. 8, and FIG. 10, one type of the sub-pixels among the first sub-pixels 1 and the third sub-pixels 3 have the substantial same shape in at least one of the first display sub-area A1, the transition display sub-area A3, and the second display sub-area A2. For example, the first sub-pixels 1 and the third sub-pixels 3 in the first display sub-area A1 may be substantially the same shape, or the first sub-pixels 1 in the first display sub-area A1 may be substantially the same shape, or the third sub-pixels 3 in the first display sub-area A1 may be substantially the same shape, or the first sub-pixels 1 in the transition display sub-area A3 may be substantially the same shape, or the third sub-pixels 3 in the transition display sub-area A3 may be substantially the same shape, or the first sub-pixels 1 and the third sub-pixels 3 in the transition display sub-area A3 may be substantially the same shape, or the first sub-pixels 1 and the third sub-pixels 3 in the second display sub-area A2 may be substantially the same shape, or the first sub-pixels 1 in the second display sub-area A2 may be substantially the same shape, or the respective third sub-pixels 3 in the second display sub-area A2 may be substantially the same shape, or the first sub-pixels 1 in the transition display sub-area A3 and the first sub-pixels 1 in the first display sub-area A1 may be substantially the same shape, or the third sub-pixels 3 in the transition display sub-area A3 and the third sub-pixels 3 in the first display sub-area A1 may be substantially the same shape, or the first sub-pixels 1 and the third sub-pixels 3 in the transition display sub-area A3 may be substantially the same shape as the first sub-pixels 1 and the third sub-pixels 3 in the first display sub-area A1, or the like, and a repeated description thereof will be omitted here.

Optionally in the display substrate according to the embodiment of this disclosure, as illustrated in FIG. 2 to FIG. 7, the shape of the second sub-pixels 2 in at least one of the second display sub-area A2 and the transition display sub-area A3 is substantially the same as the shape of the second sub-pixels 2 in the first display sub-area A1. For example, the shape of the second sub-pixels 2 in the second display sub-area A2 can be substantially the same as the shape of the second sub-pixels 2 in the first display sub-area A1, or the shape of the second sub-pixels 2 in the transition display sub-area A3 can be substantially the same as the shape of the second sub-pixels 2 in the first display sub-area A1, or the shape of the second sub-pixels 2 in both the second display sub-area A2 and the transition display sub-area A3 can be substantially the same as the shape of the second sub-pixels 2 in the first display sub-area A1.

Optionally in the display substrate according to the embodiment of this disclosure, as illustrated in FIG. 2 to FIG. 5, alternatively in at least one of the first display sub-area A1, the transition display sub-area A3, and the second display sub-area A2, the shape of the first sub-pixels 1, the shape of the second sub-pixels 2, and the shape of the third sub-pixels 3 may be substantially same. For example, the shape of the first sub-pixels 1, the shape of the second sub-pixels 2, and the shape of the third sub-pixels 3 are substantially same in the first display sub-area A1, or the shape of the first sub-pixels 1, the shape of the second sub-pixels 2, and the shape of the third sub-pixels 3 may be substantially same in the second display sub-area A2, or the shape of the first sub-pixels 1, the shape of the second sub-pixels 2, and the shape of the third sub-pixels 3 may be substantially same in the transition display sub-area A3, or the shape of the first sub-pixels 1, the shape of the second sub-pixels 2, and the shape of the third sub-pixels 3 may be substantially same in the first display sub-area A1, the transition display sub-area A3, and the second display sub-area A2.

Figure 8:
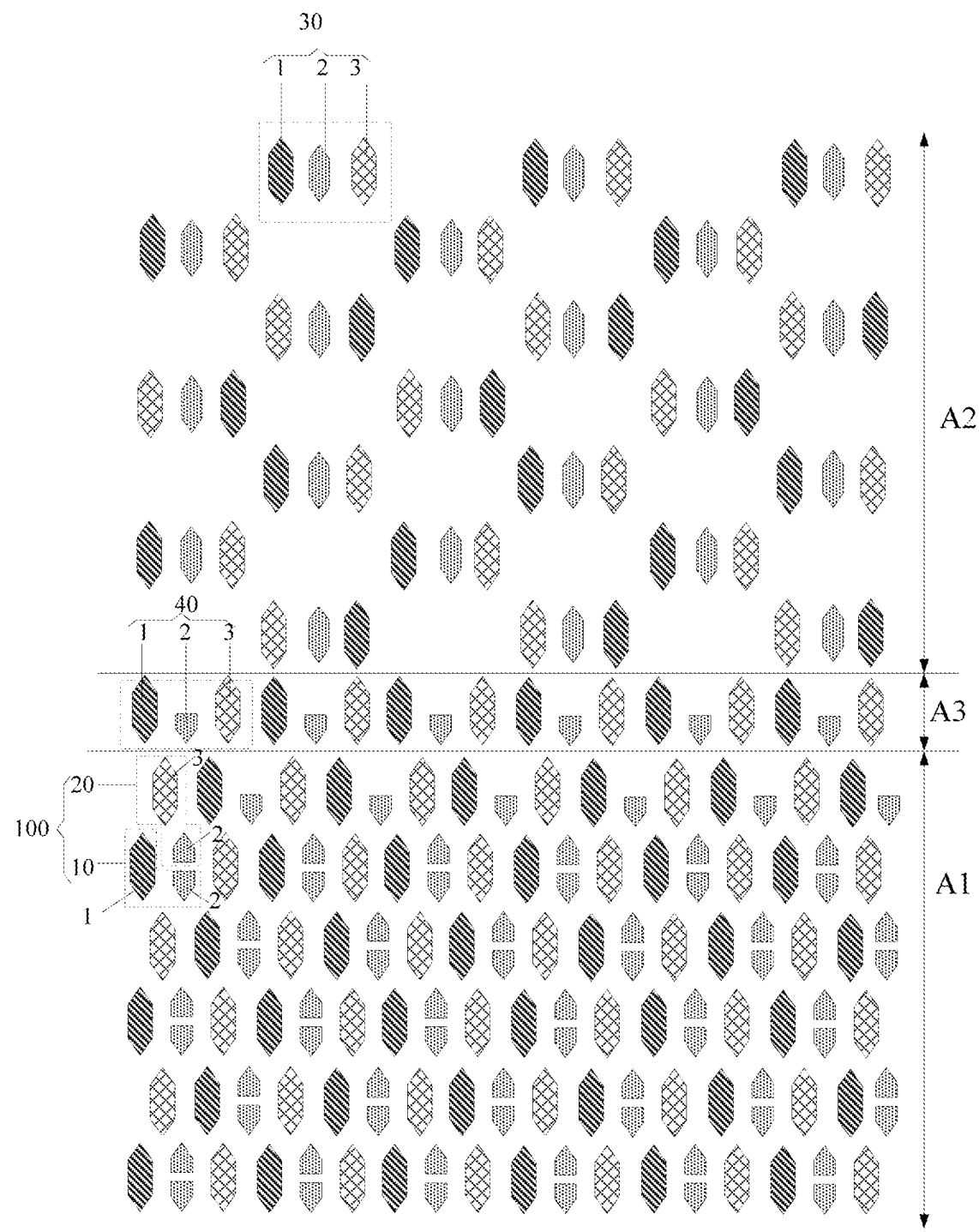
FIG. 8 is a seventh schematic partial structural diagram of the display substrate according to the embodiment of this disclosure.

It shall be noted that, take the case as an example that the shape of the first sub-pixels 1, the shape of the second sub-pixels 2, and the shape of the third sub-pixels 3 in the same sub-area are substantially same, and when there is substantially the same shape of these three types of sub-pixels, there may be different light-emitting areas of these three types of sub-pixels. As illustrated in FIG. 8 to FIG. 10, for example, the light-emitting area of the second sub-pixel 2 is smaller than the light-emitting area of the first sub-pixel 1, and the light-emitting area of the second sub-pixel 2 is smaller than the light-emitting area of the third sub-pixel 3, in the second display sub-area A2. Furthermore in a real application, for example, they can be arranged in an implementation in which a light-emitting area of a blue sub-pixel is larger than a light-emitting area of a red sub-pixel, which is larger than a light-emitting area of a green sub-pixel, or a light-emitting area of a blue sub-pixel is larger than a light-emitting area of a green sub-pixel, which is larger than a light-emitting area of a red sub-pixel, although the embodiment of this disclosure will not be limited thereto.

Of course, there may be alternatively different shapes of the sub-pixels in the different display sub-areas, although the embodiment of this disclosure will not be limited thereto.

Optionally in the display substrate according to the embodiment of this disclosure, the shape of a first sub-pixel can be at least one of a rectangle and a hexagon. As illustrated in FIG. 2 to FIG. 5, for example, the shape of a first sub-pixel 1 in each display sub-area can be rectangle. Alternatively as illustrated in FIG. 6 to FIG. 8, and FIG. 10, the shape of a first sub-pixel 1 in each display sub-area can be hexagon. Alternatively as illustrated in FIG. 9, the shape of a first sub-pixel 1 in each of the first display sub-area A1 and the transition display sub-area A3 can be hexagon, and the shape of a first sub-pixel 1 in the second display sub-area A2 can be rectangle. Of course, the shape of a first sub-pixel can alternatively be a rounded shape, elliptic, etc., although the embodiment of this disclosure will not be limited thereto.

Optionally in the display substrate according to the embodiment of this disclosure, as illustrated in FIG. 6 to FIG. 10, both of the shapes of the first sub-pixel 1 and the third sub-pixel 3 are hexagon, and the shape of a combination of two sub-pixels 2 is hexagon, in the first display sub-area A1.

It shall be noted that in the display substrate according to the embodiment of this disclosure, the shape of a sub-pixel may refer to the shape of a light-emitting area of the sub-pixel. Of course, the shape of a sub-pixel can be determined according to a real application environment, although the embodiment of this disclosure will not be limited thereto.

Figure 7:
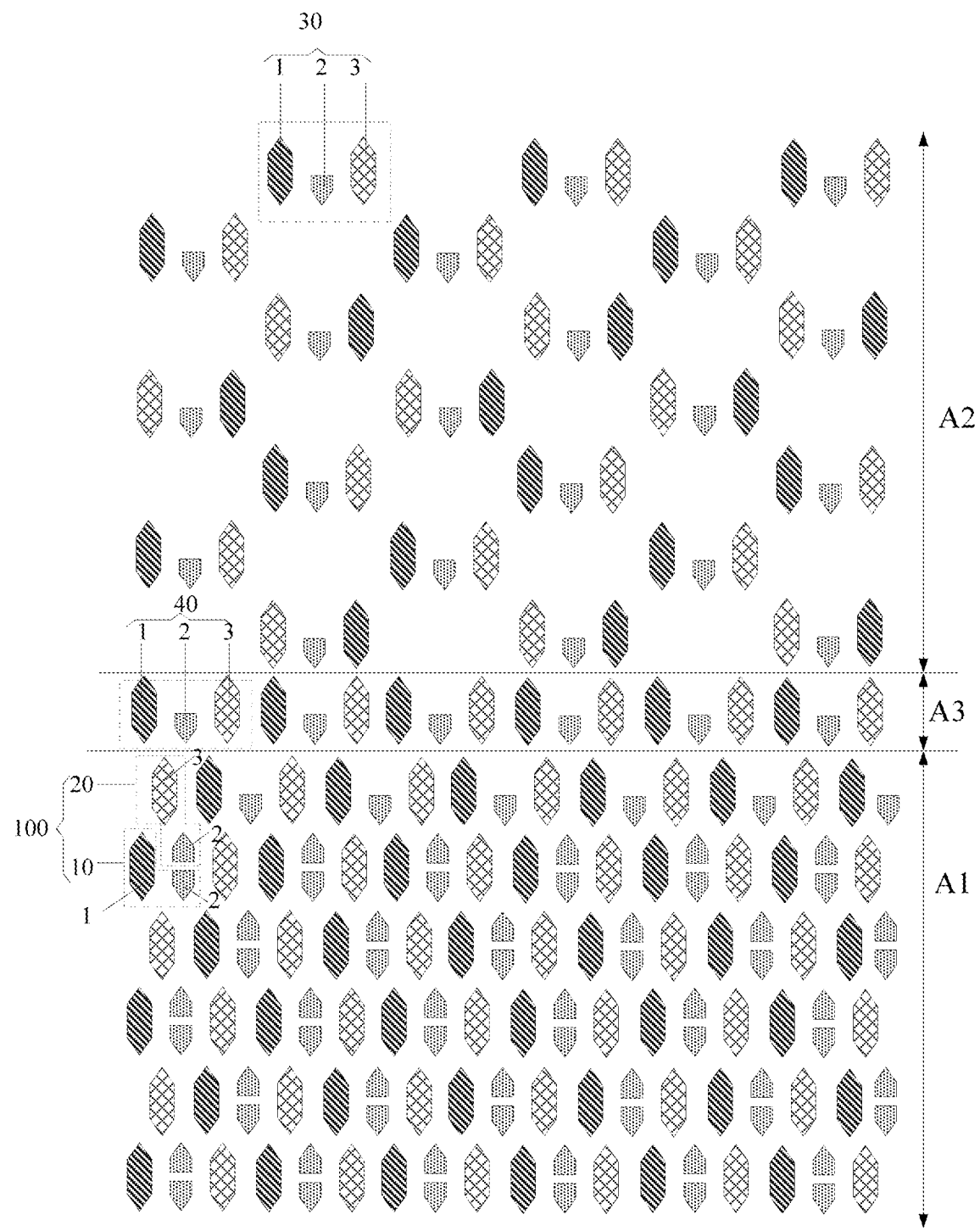
FIG. 7 is a sixth schematic partial structural diagram of the display substrate according to the embodiment of this disclosure.

Optionally in the display substrate according to the embodiment of this disclosure, as illustrated in FIG. 6 to FIG. 8, when the second sub-pixels 2 in the second display sub-area A2 are green sub-pixels, a light-emitting area of a second sub-pixel 2 is smaller than a light-emitting area of a first sub-pixel 1, and a light-emitting area of a second sub-pixel 2 is smaller than a light-emitting area of a third sub-pixel 3.

Optionally in the display substrate according to the embodiment of this disclosure, the shape of the first sub-pixel 1 in the transition display sub-area A3 is substantially the same as the shape of the first sub-pixel 1 in the first display sub-area A1, the shape of the second sub-pixel 2 in the transition display sub-area A3 is substantially the same as the shape of the second sub-pixel 2 in the first display sub-area A1, and the shape of the third sub-pixel 3 in the transition display sub-area A3 is substantially the same as the shape of the third sub-pixel 3 in the first display sub-area A1.

Optionally in the display substrate according to the embodiment of this disclosure, as illustrated in FIG. 6 to FIG. 10, when the second sub-pixels 2 in the transition display sub-area A3 are green sub-pixels, a light-emitting area of a second sub-pixel 2 is smaller than a light-emitting area of a first sub-pixel 1, and a light-emitting area of a second sub-pixel 2 is smaller than a light-emitting area of a third sub-pixel 3.

Based upon the same inventive idea, an embodiment of this disclosure further provides a display substrate, as illustrated in FIG. 1A to FIG. 1H, a display area of the display substrate includes a first display sub-area A1, a second sub-area A2. As illustrated in FIG. 8-9, the first display sub-area A1 includes a plurality of pixel groups 100, each of the plurality of pixel groups 100 includes a first sub-pixel 1, two second sub-pixels 2 and a third sub-pixel 3 adjacent to each other, the two second sub-pixels 2 are adjacent to each other and arranged in a column direction, and the plurality of pixel groups 100 are arranged in a row direction to form a plurality of rows of pixels. The second display sub-area A2 includes a plurality of third pixel elements 30, each of the plurality of third pixel elements 30 includes a first sub-pixel 1, a second sub-pixel 2 and a third sub-pixel 3 adjacent to each other, the plurality of third pixel elements 30 are arranged in the row direction to form a plurality of rows of pixels, and third pixel elements 30 in two adjacent rows of pixels are staggered. A distribution density of pixels in the first display sub-area A1 is greater than a distribution density of pixels in the second display sub-area A2.

In the display substrate according to the embodiment of this disclosure, the display area includes the first display sub-area in which pixels are distributed at a high density (e.g., a high resolution), and the second display sub-area in which pixels are distributed at a low density (e.g., a low resolution). Since the distribution density of pixels in the second display sub-area is lower, a camera and other elements can be arranged in the second display sub-display area, that is, the distribution density of the local pixels can be lowered to thereby improve the transmittivity of a screen so as to improve a screen-to-body ratio of the display substrate. Further, the third pixel elements in any two adjacent rows of pixels of the plurality of rows of pixels arranged in the row direction are staggered, so that the third pixel elements 30 are distributed uniformly in the row direction and the column direction to thereby guarantee uniform brightness in the second display sub-area.

Optionally in the display substrate according to the embodiments of this disclosure, as illustrated in FIGS. 6-10, in the first display sub-area A1, the plurality of pixel groups 100 are arranged in the column direction to form a plurality of columns of pixels, pixel groups 100 in two adjacent rows of pixels are staggered and pixel groups 100 in two adjacent columns of pixels are staggered, thereby ensuring uniform brightness in the first display sub-area A1.

Optionally in the display substrate according to the embodiment of this disclosure, as illustrated in FIG. 9, a shape of at least one sub-pixel in the first display sub-area A1 is different from a shape of a sub-pixel having a same color as the at least one sub-pixel in the second display sub-area A2, so diffraction problems can be avoided in the second display sub-area A2.

Optionally in the display substrate according to the embodiment of this disclosure, as illustrated in FIG. 9, the shapes of the first sub-pixel 1, the second sub-pixel 2, and the third sub-pixel 3 in the second display sub-area A2 are rectangular. Since the rectangle is a regular shape, it is generally easy to form from the perspective of a process.

Optionally in the display substrate according to the embodiment of this disclosure, as illustrated in FIG. 7, in the second display sub-area A2, lines connecting centers of the first sub-pixel 1, the second sub-pixel 2 and the third sub-pixel 3 in a same third pixel element 30 form a triangle, thereby avoiding traverse bright and dark strips from occurring in the second display sub-area A2.

Optionally in the display substrate according to the embodiment of this disclosure, as illustrated in FIG. 7, in the second display sub-area A2, a line connecting centers of the two sub-pixels in the same third pixel element 30 is parallel to the row direction.

Optionally in the display substrate according to the embodiment of this disclosure, as illustrated in FIGS. 2-10, the display substrate further includes a transition display sub-area A3 arranged between the first display sub-area A1 and the second display sub-area A2; a distribution density of pixels in the transition display sub-area A3 is lower than the distribution density of pixels in the first display sub-area A1, and the distribution density of pixels in the transition display sub-area A3 is higher than the distribution density of pixels in the second display sub-area A2. The transition display sub-area, in which the distribution density of pixels (the resolution) is between the distribution density of pixels in the first display sub-area and the distribution density of pixels in the second display sub-area, is arranged between the first display sub-area and the second display sub-area, so that brightness in the first display sub-area can transition to brightness in the second display sub-area through the transition display sub-area to thereby avoid a dark strip from occurring at the interface between the first display sub-area and the second display sub-area.

Optionally in the display substrate according to the embodiment of this disclosure, as illustrated in FIGS. 2-10, the transition display sub-area A3 includes a plurality of fourth pixel elements 40, each of the plurality of fourth pixel elements 40 includes a first sub-pixel 1, a second sub-pixel 1, and a third sub-pixel 3 adjacent to each other.

Optionally in the display substrate according to the embodiment of this disclosure, as illustrated in FIGS. 8-9, lines connecting centers of the first sub-pixel 1, the second sub-pixel 2 and the third sub-pixel 3 in a same fourth pixel element 40 form a triangle, thereby avoiding traverse bright and dark strips from occurring in the transition display sub-area A3.

Optionally in the display substrate according to the embodiment of this disclosure, as illustrated in FIG. 9, the shapes of sub-pixels with a same color in the transition display sub-area A3 and the first display sub-area A1 are the same, and the shapes of sub-pixels with a same color in the transition display sub-area A3 and the second display sub-area A2 are different. For example, the shape of the first sub-pixel 1 in the transition display sub-area A3 is the same as the shape of the first sub-pixel 1 in the first display sub-area A1 and is different from the shape of the first sub-pixel 1 in the second display sub-area A2; the shape of the second sub-pixel 2 in the transition display sub-area A3 is the same as the shape of the second sub-pixel 2 in the first display sub-area A1 and is different from the shape of the second sub-pixel 2 in the second display sub-area A2; and the shape of the third sub-pixel 3 in the transition display sub-area A3 is the same as the shape of the third sub-pixel 3 in the first display sub-area A1 and is different from the shape of the third sub-pixel 3 in the second display sub-area A2.

Optionally in the display substrate according to the embodiment of this disclosure, as illustrated in FIG. 9, a light-emitting area of a sub-pixel in the transition display sub-area A3 is equal to a light-emitting area of a sub-pixel in the first display sub-area A2 that have a same color as the sub-pixel in the transition display sub-area A3, and is smaller than a light-emitting area of a sub-pixel in the second display sub-area that have the same color as the sub-pixel in the transition display sub-area.

Optionally in the display substrate according to the embodiment of this disclosure, as illustrated in FIG. 8, a length of the first sub-pixel 1 and a length of the third sub-pixel 3 in the row direction are greater than a length of the second sub-pixel 2 in the row direction.

Optionally in the display substrate according to the embodiment of this disclosure, as illustrated in FIG. 8, in the second display sub-area A2, a light-emitting area of the second sub-pixel 2 is smaller than a light-emitting area of the third sub-pixel 3.

Optionally in the display substrate according to the embodiment of this disclosure, as illustrated in FIG. 9, a light-emitting area of a sub-pixel in the second display sub-area A2 is greater than a light-emitting area of a sub-pixel in the first display sub-area A1 that have a same color as the sub-pixel in the second display sub-area A2. That is, the light-emitting areas of the sub-pixels in the second display sub-area A2 can be increased to thereby lower the difference in brightness between the second display sub-area A2 and the first display sub-area A1 so as to alleviate the dark strip at the interface between the second display sub-area A2 and the first display sub-area A1.

Optionally in the display substrate according to the embodiment of this disclosure, as illustrated in FIG. 7, in the second display sub-area A2, a maximum length of the first sub-pixel 1 in the column direction is greater than twice a maximum length of the second sub-pixel 2 in the column direction.

Optionally in the display substrate according to the embodiment of this disclosure, as illustrated in FIGS. 2 and 9, first sub-pixels 1, second sub-pixels 2 and third sub-pixels 3 of third pixel elements 30 in a same column of pixels are respectively arranged on a same straight line extending along the column direction.

Optionally, in the display substrate according to the embodiment of this disclosure, the pixels in the first display sub-area are arranged in a Pantile pattern, and the pixels in the second display sub-area are arranged in a Real pattern.

Optionally, in the display substrate according to the embodiment of this disclosure, the first sub-pixel is a red sub-pixel, the second sub-pixel is a green sub-pixel, and the third sub-pixel is a blue sub-pixel.

Figure 11:
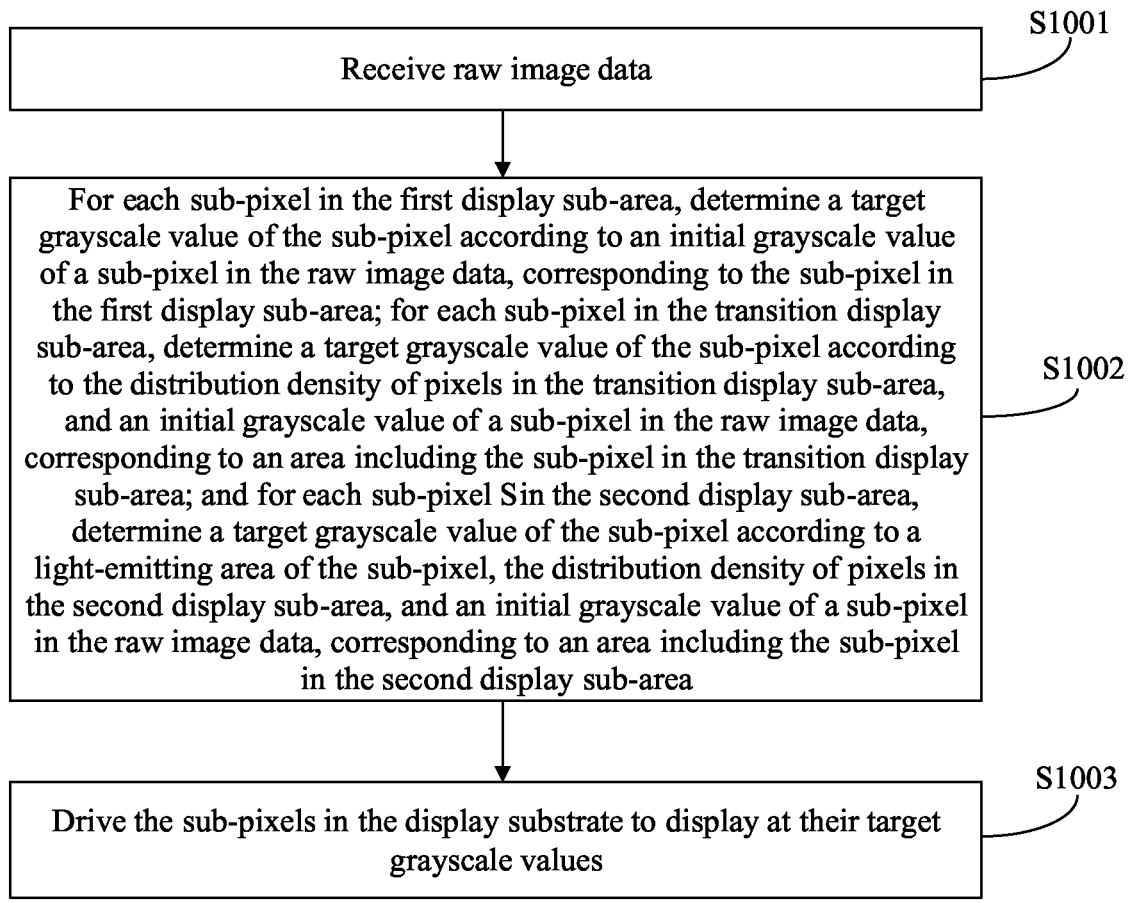
FIG. 11 is a schematic flow chart of a method for driving the display substrate according to an embodiment of this disclosure.

Based upon the same inventive idea, an embodiment of this disclosure further provides a method for driving the display substrate according to any one of the embodiments above of this disclosure. As illustrated in FIG. 11, the method includes the following steps.

The step S1001 is to receive raw image data.

The step S1002 is, for each sub-pixel in the first display sub-area, to determine a target grayscale value of the sub-pixel according to an initial grayscale value of a sub-pixel in the raw image data, corresponding to the sub-pixel in the first display sub-area; for each sub-pixel in the transition display sub-area, to determine a target grayscale value of the sub-pixel according to the distribution density of pixels in the transition display sub-area and an initial grayscale value of a sub-pixel in the raw image data, corresponding to an area including the sub-pixel in the transition display sub-area; and for each sub-pixel in the second display sub-area, to determine a target grayscale value of the sub-pixel according to a light-emitting area of the sub-pixel, the distribution density of pixels in the second display sub-area, and an initial grayscale value of a sub-pixel in the raw image data, corresponding to an area including the sub-pixel in the second display sub-area.

The step S1003 is to drive the sub-pixels in the display substrate to display at their target grayscale values.

Specifically for a sub-pixel in the first display sub-area, when a physical pixel in the first display sub-area corresponds to a pixel in the image data, a target grayscale value of the sub-pixel is generally an initial grayscale value thereof; and when the number of physical pixels in the first display sub-area is less than the number of pixels in the image data, there is a borrowing relationship between displaying sub-pixels, so a sub-pixel may correspond to two or more pixels in the image data, and thus the target grayscale value of the sub-pixel shall be calculated according to the initial grayscale value of the sub-pixel in the raw image data, corresponding thereto.

For each sub-pixel in the second display sub-area, there is a low resolution, and when an image is displayed, a physical pixel corresponds to a pixel in the image data, and a target grayscale value of the sub-pixel is generally an initial grayscale value thereof. However there may be such a problem there is a low resolution of the second display sub-area, and when the image is displayed directly at the initial grayscale value, then there may be such a significant difference in brightness between the second display sub-area and the first display sub-area that there may be an apparent dark strip at the interface between the second display sub-area and the first display sub-area. In order to address this problem, the method according to this embodiment of this disclosure can adjust the grayscale value of the sub-pixel in the second display sub-area according to the light-emitting area of the sub-pixel, and the distribution density of pixels in the second display sub-area. For example, when there is a larger light-emitting area of the sub-pixel, there is higher overall brightness in the second display sub-area, and when there are a larger number of sub-pixels distributed in the second display sub-area, then there may be higher overall brightness in the second display sub-area.

For a sub-pixel in the transition display sub-area, when an image is displayed, a physical pixel corresponds to a pixel in the image data, and since the distribution density of pixels in the distribution density of pixels lies between the distribution density of pixels in the second display sub-area, and the distribution density of pixels in the first display sub-area, brightness of the transition display sub-area theoretically lies between brightness of the second display sub-area, and brightness of the first display sub-area, and when an image is displayed, the image can be displayed by setting brightness of the sub-pixel in the transition display sub-area as the average of brightness of corresponding sub-pixels in the image data according to the distribution density of pixels in the transition display sub-area.

It shall be noted that a physical pixel generally includes three RGB sub-pixels.

In a specific implementation, when the pixels are arranged in a Pantile pattern in the first display sub-area, both the first sub-pixels and the third sub-pixels are borrowed for displaying an image, so a first sub-pixel generally corresponds to two pixels in the image data, a third sub-pixel corresponds to two pixels in the image data, and no second sub-pixel is borrowed, and thus a second sub-pixel generally corresponds to a pixel in the image data. Accordingly optionally in the method according to the embodiment of this disclosure, determining for each sub-pixel in the first display sub-area the target grayscale value of the sub-pixel specifically can include:

Determining a target grayscale value X corresponding to a first sub-pixel in the equation of $$X = \left(\frac{x_1^{Gamma} + x_2^{Gamma}}{2}\right)^{\frac{1}{Gamma}},$$

where Gamma represents a gamma value of the display substrate, and $x_1$ and $x_2$ are initial grayscale values of two first sub-pixels in the raw image data, which correspond to the first sub-pixel in the first display sub-area;

Determining a target grayscale value Y of a second sub-pixel as an initial grayscale value y of a second sub-pixel in the raw image data, corresponding to the second sub-pixel in the first display sub-area; and Determining a target grayscale value Z corresponding to a third sub-pixel in the equation of $$Z = \left(\frac{z_1^{Gamma} + z_2^{Gamma}}{2}\right)^{\frac{1}{Gamma}},$$

where $z_1$ and $z_2$ are initial grayscale values of two third sub-pixels in the raw image data, which correspond to the third sub-pixel in the first display sub-area.

In a specific implementation, in order to alleviate a dark strip at the interface between the second display sub-area and the first display sub-area, brightness in the second display sub-area can be adjusted as appropriate, where the brightness is in proportion to a light-emitting area and the distribution density of pixels. Accordingly optionally in the method according to the embodiment of this disclosure, determining for each sub-pixel in the second display sub-area the target grayscale value of the sub-pixel specifically can include: determining the target grayscale value X corresponding to the sub-pixel in the equation of $$X = k*s*\rho\left(\frac{x_1^{Gamma} + x_2^{Gamma} + \ldots + x_n^{Gamma}}{n}\right)^{\frac{1}{Gamma}},$$

where n is any integer ranging from 1 to N, N is the number of sub-pixels in the raw image data, which correspond to the sub-pixel in the second display sub-area, Gamma represents a gamma value of the display substrate, s represents the ratio of a light-emitting area of the sub-pixel in the first display sub-area to a light-emitting area of the sub-pixel in the second display sub-area, $\rho$ represents the ratio of the distribution density of pixels in the first display sub-area to the distribution density of pixels in the second display sub-area, k is an error adjustment coefficient, and xn is an initial grayscale value of the n-th sub-pixel in the raw image data, corresponding to the sub-pixel in the second display sub-area.

In a specific implementation, the error adjustment coefficient k can be adjusted according to a real display effect of the display substrate, although the embodiment of this disclosure will not be limited thereto.

In a specific implementation, if there are m third pixel elements in a unit area in the second display sub-area, and there are j pixels in the image data in the corresponding area, then one third pixel element corresponds to j/m pixels in image data, that is, N=j/m. A target grayscale value of a sub-pixel can be determined according to any one or more of N sub-pixels corresponding thereto. For example, with N=4, a target grayscale value of a sub-pixel can be determined according to initial grayscale values of any one or more of four sub-pixels in image data corresponding thereto. For example, if it is determined according to an initial grayscale value of one of the sub-pixels, then $X=k*s*\rho*x_1$, where $x_1$ represents an initial grayscale value of any one of the four corresponding sub-pixels in image data. For example, if it is determined according to initial grayscale values of two of the corresponding sub-pixels, then $$X = k*s*\rho\left(\frac{x_1^{Gamma} + x_2^{Gamma}}{2}\right)^{\frac{1}{Gamma}},$$

where $x_1$ and $x_2$ are initial grayscale values of any two of the four corresponding sub-pixels. For example, if it is determined according to initial grayscale values of three of the corresponding sub-pixels in image data, then $$X = k*s*\rho\left(\frac{x_1^{Gamma} + x_2^{Gamma} + x_3^{Gamma}}{3}\right)^{\frac{1}{Gamma}},$$

where $x_1$, $x_2$, and $x_3$ are initial grayscale values of any three of the four corresponding sub-pixels in image data. For example, if it is determined according to initial grayscale values of the four corresponding sub-pixels, then $$X = k * s * \rho \left( \frac{x_1^{Gamma} + x_2^{Gamma} + x_3^{Gamma} + x_4^{Gamma}}{4} \right)^{\frac{1}{Gamma}},$$

where $x_1$, $x_2$, $x_3$, and $x_4$ are initial grayscales of the four corresponding sub-pixels in image data.

Optionally in the method according to the embodiment of this disclosure, determining for each sub-pixel in the transition display sub-area the target grayscale value of the sub-pixel specifically can include:

Determining the target grayscale value X corresponding to the sub-pixel in the equation $$X = k * s * \rho \left( \frac{x_1^{Gamma} + x_2^{Gamma} + \ldots + x_N^{Gamma}}{N} \right)^{\frac{1}{Gamma}},$$

of where N is the number of sub-pixels in the raw image data, which correspond to the sub-pixel in the transition display sub-area, Gamma represents a gamma value of the display substrate, s represents the ratio of a light-emitting area of the sub-pixel in the first display sub-area to a light-emitting area of the sub-pixel in the second display sub-area, ρ represents the ratio of the distribution density of pixels in the first display sub-area to the distribution density of pixels in the second display sub-area, k is an error adjustment coefficient, and $x_1$ to xN are initial grayscale values of N sub-pixels respectively in the raw image data, corresponding to the sub-pixel in the transition display sub-area.

In a specific implementation, if there are m third pixel elements in a unit area in the transition display sub-area, and there are j pixels in image data of a corresponding area, then one third pixel element may correspond to j/m pixels in image data, that is, N=j/m. A target grayscale value of a sub-pixel in the transition display sub-area can be determined according to initial grayscale values of N sub-pixels corresponding thereto.

Or optionally in the method according to the embodiment of this disclosure, determining for each sub-pixel in the transition display sub-area the target grayscale value of the sub-pixel specifically can include:

Determining a target grayscale value X corresponding to a first sub-pixel in the transition display sub-area in the equation of $$X = k * s * \rho \left( \frac{x_1^{Gamma} + x_2^{Gamma}}{2} \right)^{\frac{1}{Gamma}},$$

where
Gamma represents a gamma value of the display substrate, and $x_1$ and $x_2$ are initial grayscale values of two first sub-pixels in the raw image data, which correspond to the first sub-pixel in the transition display sub-area;

Determining a target grayscale value Y of a second sub-pixel in the transition display sub-area in the equation of Y=k*s*ρ*y, where y represents an initial grayscale value y of a second sub-pixel in the raw image data, corresponding to the second sub-pixel in the transition display sub-area; and Determining a target grayscale value Z corresponding to a third sub-pixel in the transition display sub-area in the equation of $$Z = k * s * \rho \left( \frac{z_1^{Gamma} + z_2^{Gamma}}{2} \right)^{\frac{1}{Gamma}},$$

where $z_1$ and $z_2$ are initial grayscale values of two third sub-pixels in the raw image data, which correspond to the third sub-pixel in the transition display sub-area.

Where s represents the ratio of a light-emitting area of the sub-pixel in the first display sub-area to a light-emitting area of the sub-pixel in the second display sub-area, ρ represents the ratio of the distribution density of pixels in the first display sub-area to the distribution density of pixels in the second display sub-area, and k is an error adjustment coefficient.

Stated otherwise, an algorithm for calculating a target grayscale value corresponding to a sub-pixel in the first display sub-area is modified to an algorithm for calculating a target grayscale value corresponding to a sub-pixel in the transition display sub-area according to the ratio of a light-emitting area of a sub-pixel in the first display sub-area to a light-emitting area of a sub-pixel in the second display sub-area, and the ratio of the distribution density of pixels in the first display sub-area to the distribution density of pixels in the second display sub-area.

Based upon the same inventive idea, an embodiment of this disclosure further provides a display device including the display substrate according to any one of the embodiments above of this disclosure. The display device can be a phone, a tablet, a TV set, a display, a notebook computer, a digital photo frame, a navigator, or any other product or component with a display function. Reference can be made to the embodiment of the display substrate above for an implementation of the display device, and a repeated description thereof will be omitted here.

Optionally the display device according to the embodiment of this disclosure further includes a driver configured to drive the display substrate, where the driver of the display substrate can be an Integrated Circuit (IC), an external Central Processing Unit (CPU), a micro processor, etc., and is configured:

To receive raw image data;

For each sub-pixel in the first display sub-area, to determine a target grayscale value of the sub-pixel according to an initial grayscale value of at least one sub-pixel in the raw image data, corresponding to the sub-pixel in the first display sub-area; for each sub-pixel in the transition display sub-area, to determine a target grayscale value of the sub-pixel according to the distribution density of pixels in the transition display sub-area, and an initial grayscale value of at least one sub-pixel in the raw image data, corresponding to an area including the sub-pixel in the transition display sub-area; and for each sub-pixel in the second display sub-area, to determine a target grayscale value of the sub-pixel according to a light-emitting area of the sub-pixel, the distribution density of pixels in the second display sub-area, and an initial grayscale value of at least one sub-pixel in the raw image data, corresponding to an area including the sub-pixel in the second display sub-area; and To drive the sub-pixels in the display substrate to display at their target grayscale values.

Optionally in the display device according to the embodiment of this disclosure, the driver configured to determine for each sub-pixel in the first display sub-area the target grayscale value of the sub-pixel is configured:

To determine a target grayscale value X corresponding to a first sub-pixel in the first display sub-area in the equation of $$X = \left(\frac{x_1^{Gamma} + x_2^{Gamma}}{2}\right)^{\frac{1}{Gamma}},$$

where Gamma represents a gamma value of the display substrate, and $x_1$ and $x_2$ are initial grayscale values of two first sub-pixels in the raw image data, which correspond to the first sub-pixel in the first display sub-area;

To determine a target grayscale value Y of a second sub-pixel in the first display sub-area as an initial grayscale value y of a second sub-pixel in the raw image data, corresponding to the second sub-pixel in the first display sub-area; and To determine a target grayscale value Z corresponding to a third sub-pixel in the first display sub-area in the equation of $$Z = \left(\frac{z_1^{Gamma} + z_2^{Gamma}}{2}\right)^{\frac{1}{Gamma}},$$

where $z_1$ and $z_2$ are initial grayscales of two third sub-pixels in the raw image data, which correspond to the third sub-pixel in the first display sub-area.

In an implementation, in order to alleviate a dark strip at the interface between the second display sub-area and the first display sub-area, brightness in the second display sub-area can be adjusted as appropriate, where the brightness is in proportion to a light-emitting area and the distribution density of pixels. Accordingly optionally in the display device according to the embodiment of this disclosure, the driver configured to determine for each sub-pixel in the second display sub-area the target grayscale value of the sub-pixel is configured: to determine the target grayscale value X corresponding to the sub-pixel in the second display sub-area in the equation of $$X = k*s*\rho\left(\frac{x_1^{Gamma} + x_2^{Gamma} + \ldots + x_n^{Gamma}}{n}\right)^{\frac{1}{Gamma}},$$

where n is any integer ranging from 1 to N, N is the number of sub-pixels in the raw image data, which correspond to the sub-pixel in the second display sub-area, Gamma represents a gamma value of the display substrate, s represents the ratio of a light-emitting area of the sub-pixel in the first display sub-area to a light-emitting area of the sub-pixel in the second display sub-area, ρ represents the ratio of the distribution density of pixels in the first display sub-area to the distribution density of pixels in the second display sub-area, k is an error adjustment coefficient, and $x_1$, is an initial grayscale value of the n-th sub-pixel in the raw image data, corresponding to the sub-pixel in the second display sub-area.

In a specific implementation, the error adjustment coefficient k can be adjusted according to a real display effect of the display substrate, although the embodiment of this disclosure will not be limited thereto.

Optionally in the display device according to the embodiment of this disclosure, the driver configured to determine for each sub-pixel in the transition display sub-area the target grayscale value of the sub-pixel is configured: to determine the target grayscale value X corresponding to the sub-pixel in the transition display sub-area in the equation of $$X = k*s*\rho\left(\frac{x_1^{Gamma} + x_2^{Gamma} + \ldots + x_N^{Gamma}}{N}\right)^{\frac{1}{Gamma}},$$

where N is the number of sub-pixels in the raw image data, which correspond to the sub-pixel in the transition display sub-area, Gamma represents a gamma value of the display substrate, s represents the ratio of a light-emitting area of the sub-pixel in the first display sub-area to a light-emitting area of the sub-pixel in the second display sub-area, ρ represents the ratio of the distribution density of pixels in the first display sub-area to the distribution density of pixels in the second display sub-area, k is an error adjustment coefficient, and $x_1$ to $x_N$ are initial grayscale values of N sub-pixels respectively in the raw image data, corresponding to the sub-pixel in the transition display sub-area.

Alternatively optionally in the display device according to the embodiment of this disclosure, the driver configured to determine for each sub-pixel in the transition display sub-area the target grayscale value of the sub-pixel is configured:

To determine a target grayscale value X corresponding to a first sub-pixel in the transition display sub-area in the equation of $$X = k*s*\rho\left(\frac{x_1^{Gamma} + x_2^{Gamma}}{2}\right)^{\frac{1}{Gamma}},$$

where
Gamma represents a gamma value of the display substrate, and $x_1$ and $x_2$ are initial grayscale values of two first sub-pixels in the raw image data, which correspond to the first sub-pixel in the transition display sub-area; To determine a target grayscale value Y of a second sub-pixel in the equation of Y=k*s*ρ*y, where y represents an initial grayscale value y of a second sub-pixel in the raw image data, corresponding to the second sub-pixel in the transition display sub-area; and To determine a target grayscale value Z corresponding to a third sub-pixel in the equation of $$Z = k*s*\rho\left(\frac{z_1^{Gamma} + z_2^{Gamma}}{2}\right)^{\frac{1}{Gamma}},$$

where $z_1$ and $z_2$ are initial grayscale values of two third sub-pixels in the raw image data, which correspond to the third sub-pixel in the transition display sub-area.

Where s represents the ratio of a light-emitting area of the sub-pixel in the first display sub-area to a light-emitting area of the sub-pixel in the second display sub-area, ρ represents the ratio of the distribution density of pixels in the first display sub-area to the distribution density of pixels in the second display sub-area, and k is an error adjustment coefficient.

Reference can be made to the implementation of the driver in the display device above for details of the method according to the embodiment of this disclosure.

In a specific implementation, in the display device according to the embodiment of this disclosure, the driver integrates all the algorithms for calculating the target grayscale values of the sub-pixels in the respective sub-areas into an IC. When an image is displayed, the driver determines the target grayscale values corresponding to the respective sub-pixels according to the received image data.

Furthermore before the display substrates displays at the target grayscale values, in order to improve the uniformity of brightness, generally a Demura algorithm shall also be performed. A specific Demura algorithm is known in the art, so a repeated description thereof will be omitted here.

Based upon the same inventive idea, an embodiment of this disclosure further provides a high-precision metal mask for fabricating the display substrate according to any one of the embodiments of this disclosure, where the high-precision metal mask includes a plurality of opening areas 01 corresponding in shape and position to the first sub-pixels, the second sub-pixels, or the third sub-pixels.

Figure 12:
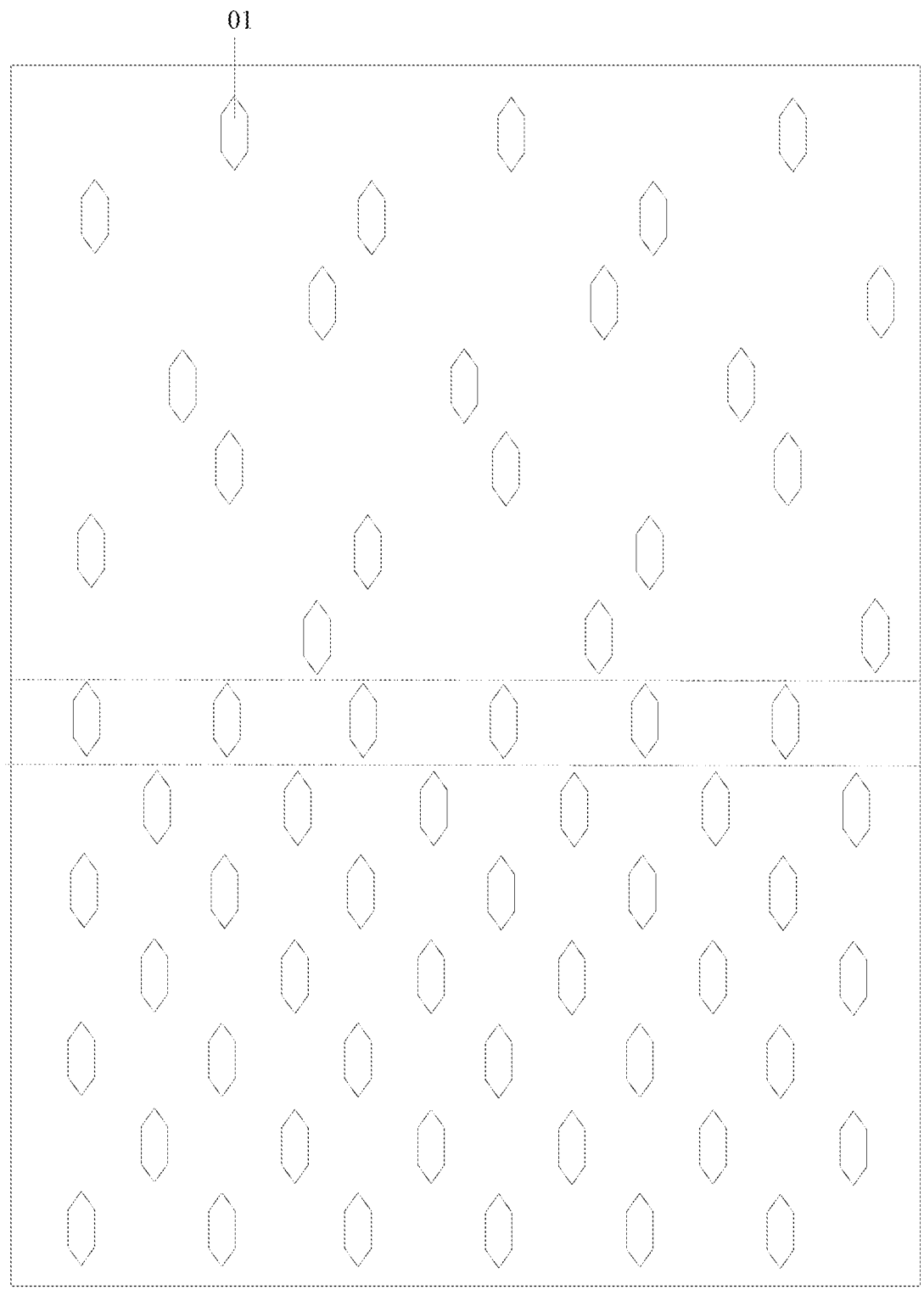
FIG. 12 is a schematic structural diagram of a high-precision metal mask according to an embodiment of this disclosure.

In a specific implementation, each sub-pixel generally includes an anode layer, a light-emitting layer, and a cathode layer, where the light-emitting layer is generally evaporated using the high-precision metal mask above. Taking the display substrate as illustrated in FIG. 8 as an example, the high-precision metal mask for forming the first sub-pixels includes opening areas 01 corresponding in shape and position to the light-emitting layers of the first substrate 1 in the display substrate as illustrated in FIG. 12. The area of an opening area 01 is generally larger than an area of a corresponding light-emitting area due to a limiting process factor. Principles of high-precision metal mask for forming the second sub-pixels, and the high-precision metal mask for forming the third sub-pixels are similar to the principle of the high-precision metal mask for forming the first sub-pixels, so a repeated description thereof will be omitted here.

In the display substrate, the method for driving the same, the display device, and the high-precision metal mask above according to the embodiments of this disclosure, the display area includes the first display sub-area with a high distribution density of pixels (i.e., a high resolution), and the second display sub-area with a low distribution density of pixels (i.e., a low resolution), and since the distribution density of pixels in the second display sub-area is low, a camera and another element can be arranged in the second display sub-area, that is, the distribution density of the local pixels can be lowered to thereby improve the transmittivity of a screen so as to improve a screen-to-body ratio of the display substrate. Furthermore the transition display sub-area with the distribution density of pixels (the resolution) between the distribution density of pixels in the first display sub-area, and the distribution density of pixels in the second display sub-area can be arranged between the first display sub-area and the second display sub-area so that the brightness in the first display sub-area can transition to the brightness in the second display sub-area through the transition display sub-area to thereby avoid a dark strip from occurring at the interface between the first display sub-area and the second display sub-area. Furthermore in order to drive the display substrate, the grayscale value of a sub-pixel in the second display sub-area can be adjusted according to the light-emitting area of the sub-pixel, and the distribution density of pixels, in the second display sub-area to thereby compensate for a significant difference in brightness between the second display sub-area and the first display sub-area due to the difference between the distribution density of pixels in the first display sub-area, and the distribution density of pixels in the second display sub-area so as to alleviate a dark strip from occurring at the interface between the first display sub-area and the second display sub-area, so that the image can be displayed throughout the screen.

Evidently those skilled in the art can make various modifications and variations to the invention without departing from the spirit and scope of the invention. Thus the invention is also intended to encompass these modifications and variations thereto so long as the modifications and variations fall into the scope of the claims appended to the invention and their equivalents.

The invention claimed is:

1. A display substrate, comprising a display area comprising a first display sub-area and a second display sub-area; wherein the first display sub-area comprises a plurality of pixel groups, each of the plurality of pixel groups comprises a first pixel element and a second pixel element comprising a first sub-pixel, two second sub-pixels and a third sub-pixel adjacent to each other, the two second sub-pixels are adjacent to each other and arranged in a column direction and the plurality of pixel groups are arranged in a row direction to form a plurality of rows of pixels; the second display sub-area comprises a plurality of third pixel elements, each of the plurality of third pixel elements comprises a first sub-pixel, a second sub-pixel and a third sub-pixel adjacent to each other, the plurality of third pixel elements are arranged in the row direction to form a plurality of rows of pixels, and third pixel elements in two adjacent rows of pixels are staggered; and a distribution density of pixels in the first display sub-area is greater than a distribution density of pixels in the second display sub-area, wherein in the first display sub-area, the plurality of pixel groups are arranged in the column direction to form a plurality of columns of pixels, pixel groups in two adjacent rows of pixels are staggered and pixel groups in two adjacent columns of pixels are staggered.

2. The display substrate according to claim 1, wherein a shape of at least one sub-pixel in the first display sub-area is different from a shape of a sub-pixel having a same color as the at least one sub-pixel in the second display sub-area.

3. The display substrate according to claim 2, wherein shapes of the first sub-pixel, the second sub-pixel, and the third sub-pixel in the second display sub-area are rectangular.

4. The display substrate according to claim 1, wherein in the second display sub-area, lines connecting centers of the first sub-pixel, the second sub-pixel and the third sub-pixel in a same third pixel element form a triangle.

5. The display substrate according to claim 4, wherein in the second display sub-area, a line connecting centers of two sub-pixels in the same third pixel element is parallel to the row direction.

6. The display substrate according to claim 1, further comprising a transition display sub-area arranged between the first display sub-area and the second display sub-area; wherein a distribution density of pixels in the transition display sub-area is lower than the distribution density of pixels in the first display sub-area, and the distribution density of pixels in the transition display sub-area is higher than the distribution density of pixels in the second display sub-area.

7. The display substrate according to claim 6, wherein shapes of sub-pixels with a same color in the transition display sub-area and the first display sub-area are the same, and shapes of sub-pixels with a same color in the transition display sub-area and the second display sub-area are different.

8. The display substrate according to claim 6, wherein a light-emitting area of a sub-pixel in the transition display sub-area is equal to a light-emitting area of a sub-pixel, having a same color as the sub-pixel in the transition display sub-area, in the first display sub-area, and is smaller than a light-emitting area of a sub-pixel, having the same color as the sub-pixel in the transition display sub-area, in the second display sub-area.

9. The display substrate according to claim 6, wherein the transition display sub-area comprises a plurality of fourth pixel elements, each of the plurality of fourth pixel elements comprises a first sub-pixel, a second sub-pixel, and a third sub-pixel adjacent to each other.

10. The display substrate according to claim 9, lines connecting centers of the first sub-pixel, the second sub-pixel and the third sub-pixel in a same fourth pixel element form a triangle.

11. The display substrate according to claim 1, wherein in the second display sub-area, a length of the first sub-pixel and a length of the third sub-pixel in the row direction are greater than a length of the second sub-pixel in the row direction.

12. The display substrate according to claim 11, wherein in the second display sub-area, a light-emitting area of the second sub-pixel is smaller than a light-emitting area of the third sub-pixel.

13. The display substrate according to claim 1, wherein a light-emitting area of a sub-pixel in the second display sub-area is greater than a light-emitting area of a sub-pixel, having a same color as the sub-pixel in the second display sub-area, in the first display sub-area.

14. The display substrate according to claim 1, wherein in the second display sub-area, a maximum length of the first sub-pixel in the column direction is greater than twice a maximum length of the second sub-pixel in the column direction.

15. The display substrate according to claim 1, wherein first sub-pixels, second sub-pixels and third sub-pixels of third pixel elements in a same column of pixels are respectively arranged on a same straight line extending along the column direction.

16. The display substrate according to claim 1, wherein the pixels in the first display sub-area are arranged in a Pantile pattern, and the pixels in the second display sub-area are arranged in a Real pattern.

17. The display substrate according to claim 1, wherein the first sub-pixel is a red sub-pixel, the second sub-pixel is a green sub-pixel, and the third sub-pixel is a blue sub-pixel.

18. A display device, comprising the display substrate of claim 1.

* * * * *